(12) United States Patent
Batres et al.

(10) Patent No.: US 8,686,431 B2
(45) Date of Patent: Apr. 1, 2014

(54) GALLIUM AND NITROGEN CONTAINING TRILATERAL CONFIGURATION FOR OPTICAL DEVICES

(75) Inventors: Max Batres, Fremount, CA (US); Aurelien David, Fremont, CA (US)

(73) Assignee: Soraa, Inc., Fremont, CA (US)

( * ) Notice: Subject to any disclaimer, the term of this patent is extended or adjusted under 35 U.S.C. 154(b) by 64 days.

(21) Appl. No.: 13/281,221

(22) Filed: Oct. 25, 2011

(65) Prior Publication Data

US 2012/0199841 A1 Aug. 9, 2012

Related U.S. Application Data

(60) Provisional application No. 61/526,136, filed on Aug. 22, 2011.

(51) Int. Cl.
*H01L 29/15* (2006.01)
(52) U.S. Cl.
USPC .............................................. 257/76; 257/79
(58) Field of Classification Search
USPC ....................................................... 257/76, 79
See application file for complete search history.

(56) References Cited

U.S. PATENT DOCUMENTS

| | | | |
|---|---|---|---|
| 4,065,688 A | 12/1977 | Thornton | |
| 5,813,753 A | 9/1998 | Vriens et al. | |
| 6,335,771 B1 | 1/2002 | Hiraishi | |
| 6,498,355 B1 | 12/2002 | Harrah et al. | |
| 6,509,651 B1 | 1/2003 | Matsubara et al. | |
| 6,533,874 B1 | 3/2003 | Vaudo et al. | |
| 6,809,781 B2 | 10/2004 | Setlur et al. | |
| 6,956,246 B1 | 10/2005 | Epler et al. | |
| 7,009,199 B2 | 3/2006 | Hall | |
| 7,012,279 B2 | 3/2006 | Wierer Jr. et al. | |
| 7,128,849 B2 | 10/2006 | Setlur et al. | |
| 7,285,801 B2 | 10/2007 | Eliashevich et al. | |
| 7,341,880 B2 | 3/2008 | Erchak et al. | |
| 7,358,542 B2 | 4/2008 | Radkov et al. | |
| 7,358,543 B2 | 4/2008 | Chua et al. | |
| 7,419,281 B2 | 9/2008 | Porchia et al. | |
| 7,622,742 B2 | 11/2009 | Kim et al. | |
| 7,733,571 B1 | 6/2010 | Li | |
| 7,816,238 B2 | 10/2010 | Osada et al. | |
| 7,858,408 B2 | 12/2010 | Mueller et al. | |
| 7,862,761 B2 | 1/2011 | Okushima et al. | |
| 7,871,839 B2 | 1/2011 | Lee et al. | |
| 7,884,538 B2 | 2/2011 | Mitsuishi et al. | |
| 7,923,741 B1 | 4/2011 | Zhai et al. | |

(Continued)

FOREIGN PATENT DOCUMENTS

| | | |
|---|---|---|
| EP | 2381490 | 10/2011 |
| JP | 06-334215 | 12/1994 |
| JP | 2008-084973 | 4/2008 |
| WO | WO 2006/062880 | 6/2006 |

OTHER PUBLICATIONS

Iso et al., 'High Brightness Blue InGaN/GaN Light Emitting Diode on Nonpolar m-Plane Bulk GaN Substrate,' Japanese Journal of Applied Physics, 2007, vol. 46, No. 40, pp. L960-L962.

(Continued)

*Primary Examiner* — Douglas Menz
(74) *Attorney, Agent, or Firm* — Kilpatrick Townsend & Stockton LLP

(57) ABSTRACT

Techniques for manufacturing optical devices, such as light emitting diodes (LEDs) using a separation process of thick gallium and nitrogen containing substrate members, are described.

25 Claims, 20 Drawing Sheets

(56) References Cited

U.S. PATENT DOCUMENTS

| | | |
|---|---|---|
| 8,044,412 B2 | 10/2011 | Murphy et al. |
| 8,142,566 B2 | 3/2012 | Kiyomi et al. |
| 8,188,504 B2 | 5/2012 | Lee |
| 8,198,643 B2 | 6/2012 | Lee et al. |
| 8,207,548 B2 | 6/2012 | Nagai |
| 8,207,554 B2 | 6/2012 | Shum |
| 8,247,886 B1 | 8/2012 | Sharma et al. |
| 8,252,662 B1 | 8/2012 | Poblenz et al. |
| 8,293,551 B2 | 10/2012 | Sharma et al. |
| 8,299,473 B1 | 10/2012 | D'Evelyn et al. |
| 8,310,143 B2 | 11/2012 | Van De Ven et al. |
| 8,455,894 B1 | 6/2013 | D'Evelyn et al. |
| 8,502,465 B2 | 8/2013 | Katona et al. |
| 2001/0009134 A1 | 7/2001 | Kim et al. |
| 2001/0043042 A1 | 11/2001 | Murazaki et al. |
| 2001/0055208 A1 | 12/2001 | Kimura |
| 2002/0070416 A1 | 6/2002 | Morse et al. |
| 2002/0096994 A1 | 7/2002 | Iwafuchi et al. |
| 2002/0182768 A1 | 12/2002 | Morse et al. |
| 2003/0047076 A1 | 3/2003 | Liu |
| 2003/0164507 A1 | 9/2003 | Edmond et al. |
| 2004/0070004 A1 | 4/2004 | Eliashevich et al. |
| 2004/0080256 A1 | 4/2004 | Hampden-Smith et al. |
| 2004/0104391 A1 | 6/2004 | Maeda et al. |
| 2004/0116033 A1 | 6/2004 | Ouderkirk et al. |
| 2004/0124435 A1 | 7/2004 | D'Evelyn et al. |
| 2004/0161222 A1 | 8/2004 | Niida et al. |
| 2004/0207998 A1 | 10/2004 | Suehiro et al. |
| 2004/0251471 A1 | 12/2004 | Dwilinski et al. |
| 2005/0087753 A1 | 4/2005 | D'Evelyn et al. |
| 2005/0109240 A1 | 5/2005 | Maeta et al. |
| 2005/0121679 A1 | 6/2005 | Nagahama et al. |
| 2005/0167680 A1 | 8/2005 | Shei et al. |
| 2005/0199899 A1 | 9/2005 | Lin et al. |
| 2005/0224830 A1 | 10/2005 | Blonder et al. |
| 2005/0263791 A1 | 12/2005 | Yanagihara et al. |
| 2006/0038542 A1 | 2/2006 | Park et al. |
| 2006/0060872 A1 | 3/2006 | Edmond et al. |
| 2006/0079082 A1 | 4/2006 | Bruhns et al. |
| 2006/0118799 A1 | 6/2006 | D'Evelyn et al. |
| 2006/0163589 A1 | 7/2006 | Fan et al. |
| 2006/0166390 A1 | 7/2006 | Letertre et al. |
| 2006/0169993 A1 | 8/2006 | Fan et al. |
| 2006/0189098 A1 | 8/2006 | Edmond |
| 2006/0205199 A1 | 9/2006 | Baker et al. |
| 2006/0214287 A1 | 9/2006 | Ogihara et al. |
| 2006/0255343 A1 | 11/2006 | Ogihara et al. |
| 2006/0273339 A1 | 12/2006 | Steigerwald et al. |
| 2007/0045200 A1 | 3/2007 | Moon et al. |
| 2007/0096239 A1 | 5/2007 | Cao et al. |
| 2007/0105351 A1 | 5/2007 | Motoki et al. |
| 2007/0114569 A1 | 5/2007 | Wu et al. |
| 2007/0121690 A1 | 5/2007 | Fujii et al. |
| 2007/0131967 A1 | 6/2007 | Kawaguchi et al. |
| 2007/0202624 A1 | 8/2007 | Yoon et al. |
| 2007/0210074 A1 | 9/2007 | Maurer et al. |
| 2007/0228404 A1 | 10/2007 | Tran et al. |
| 2007/0290224 A1 | 12/2007 | Ogawa |
| 2008/0023691 A1 | 1/2008 | Jang et al. |
| 2008/0030976 A1 | 2/2008 | Murazaki et al. |
| 2008/0073660 A1 | 3/2008 | Ohno et al. |
| 2008/0083741 A1 | 4/2008 | Giddings et al. |
| 2008/0083929 A1 | 4/2008 | Fan et al. |
| 2008/0087919 A1 | 4/2008 | Tysoe et al. |
| 2008/0099777 A1 | 5/2008 | Erchak et al. |
| 2008/0106212 A1 | 5/2008 | Yen et al. |
| 2008/0121906 A1 | 5/2008 | Yakushiji |
| 2008/0128752 A1 | 6/2008 | Wu |
| 2008/0179607 A1 | 7/2008 | DenBaars et al. |
| 2008/0179610 A1 | 7/2008 | Okamoto et al. |
| 2008/0194054 A1 | 8/2008 | Lin et al. |
| 2008/0210958 A1 | 9/2008 | Senda et al. |
| 2008/0211416 A1 | 9/2008 | Negley et al. |
| 2008/0230765 A1 | 9/2008 | Yoon et al. |
| 2008/0237569 A1 | 10/2008 | Nago et al. |
| 2008/0272463 A1 | 11/2008 | Butcher et al. |
| 2008/0282978 A1 | 11/2008 | Butcher et al. |
| 2008/0303033 A1 | 12/2008 | Brandes |
| 2009/0065798 A1 | 3/2009 | Masui et al. |
| 2009/0078955 A1 | 3/2009 | Fan et al. |
| 2009/0081857 A1 | 3/2009 | Hanser et al. |
| 2009/0086475 A1 | 4/2009 | Caruso et al. |
| 2009/0140279 A1 | 6/2009 | Zimmerman et al. |
| 2009/0146170 A1 | 6/2009 | Zhong et al. |
| 2009/0194796 A1 | 8/2009 | Hashimoto et al. |
| 2009/0206354 A1 | 8/2009 | Kitano et al. |
| 2009/0227056 A1 | 9/2009 | Kyono et al. |
| 2009/0250686 A1 | 10/2009 | Sato et al. |
| 2009/0252191 A1 | 10/2009 | Kubota et al. |
| 2009/0267098 A1 | 10/2009 | Choi |
| 2009/0273005 A1 | 11/2009 | Lin |
| 2009/0309110 A1 | 12/2009 | Raring et al. |
| 2009/0315480 A1 | 12/2009 | Yan et al. |
| 2009/0321778 A1 | 12/2009 | Chen et al. |
| 2010/0001300 A1 | 1/2010 | Raring et al. |
| 2010/0006873 A1 | 1/2010 | Raring et al. |
| 2010/0032691 A1 | 2/2010 | Kim |
| 2010/0055819 A1 | 3/2010 | Ohba et al. |
| 2010/0108985 A1 | 5/2010 | Chung et al. |
| 2010/0109030 A1 | 5/2010 | Krames et al. |
| 2010/0117101 A1 | 5/2010 | Kim et al. |
| 2010/0117118 A1 | 5/2010 | Dabiran et al. |
| 2010/0290208 A1 | 11/2010 | Pickard |
| 2010/0295088 A1 | 11/2010 | D'Evelyn et al. |
| 2011/0017298 A1 | 1/2011 | Lee |
| 2011/0108081 A1 | 5/2011 | Werthen et al. |
| 2011/0121331 A1 | 5/2011 | Simonian et al. |
| 2011/0175200 A1 | 7/2011 | Yoshida |
| 2011/0182056 A1 | 7/2011 | Trottier et al. |
| 2011/0186874 A1 | 8/2011 | Shum |
| 2011/0266552 A1 | 11/2011 | Tu et al. |
| 2011/0279054 A1 | 11/2011 | Katona et al. |
| 2011/0315999 A1 | 12/2011 | Sharma et al. |
| 2011/0317397 A1 | 12/2011 | Trottier et al. |
| 2012/0007102 A1 | 1/2012 | Feezell et al. |
| 2012/0135553 A1 | 5/2012 | Felker et al. |
| 2012/0187412 A1 | 7/2012 | D'Evelyn et al. |
| 2012/0288974 A1 | 11/2012 | Sharma et al. |
| 2013/0022758 A1 | 1/2013 | Trottier |
| 2013/0026483 A1 | 1/2013 | Sharma et al. |
| 2013/0234108 A1 | 9/2013 | David et al. |

OTHER PUBLICATIONS

USPTO Office Action for U.S. Appl. No. 12/569,841 dated Dec. 23, 2011.

USPTO Office Action for U.S. Appl. No. 12/569,844 dated Oct. 12, 2012.

USPTO Notice of Allowance for U.S. Appl. No. 12/569,844 dated Mar. 7, 2013.

USPTO Notice of Allowance for U.S. Appl. No. 12/754,886 dated May 17, 2012.

USPTO Notice of Allowance for U.S. Appl. No. 12/754,886 dated Jun. 5, 2012.

USPTO Notice of Allowance for U.S. Appl. No. 12/754,886 dated Jun. 20, 2012.

USPTO Office Action for U.S. Appl. No. 12/861,765 dated Mar. 7, 2013.

USPTO Office Action for U.S. Appl. No. 12/936,238 dated Jan. 30, 2013.

USPTO Office Action for U.S. Appl. No. 13/025,833 dated Jul. 12, 2012.

USPTO Office Action for U.S. Appl. No. 13/179,346 dated Aug. 17, 2012.

USPTO Office Action for U.S. Appl. No. 13/179,346 dated Dec. 13, 2012.

USPTO Office Action for U.S. Appl. No. 12/481,543 dated Jun. 27, 2011.

USPTO Office Action for U.S. Appl. No. 12/634,665 dated Mar. 12, 2012.

USPTO Office Action for U.S. Appl. No. 12/879,784 dated Jan. 25, 2012.

(56) References Cited

OTHER PUBLICATIONS

USPTO Notice of Allowance for U.S. Appl. No. 12/879,784 dated Apr. 3, 2012.
USPTO Office Action for U.S. Appl. No. 12/880,889 dated Feb. 27, 2012.
USPTO Office Action for U.S. Appl. No. 12/995,946 dated Mar. 28, 2012.
USPTO Office Action for U.S. Appl. No. 13/014,622 dated Nov. 28, 2011.
USPTO Office Action for U.S. Appl. No. 13/014,622 dated Apr. 30, 2012.
USPTO Office Action for U.S. Appl. No. 13/019,897 dated Mar. 30, 2012.
USPTO Notice of Allowance for U.S. Appl. No. 12/720,593 dated Jul. 11, 2012.
USPTO Office Action for U.S. Appl. No. 12/861,765 dated Jul. 2, 2012.
USPTO Office Action for U.S. Appl. No. 12/936,238 dated Aug. 30, 2012.
USPTO Notice of Allowance for U.S. Appl. No. 13/163,482 dated Jul. 31, 2012.
USPTO Office Action for U.S. Appl. No. 13/465,976 dated Aug. 16, 2012.
Cich et al., 'Bulk GaN based violet light-emitting diodes with high efficiency at very high current density', Applied Physics Letters, 101, Nov. 29, 2012, pp. 223509-1-223509-3.
USPTO Office Action for U.S. Appl. No. 12/749,476 dated Apr. 11, 2011.
USPTO Office Action for U.S. Appl. No. 12/749,476 dated Nov. 8, 2011.
USPTO Notice of Allowance for U.S. Appl. No. 12/749,476 dated May 4, 2012.
USPTO Notice of Allowance for U.S. Appl. No. 12/749,476 dated Jun. 26, 2012.
USPTO Office Action for U.S. Appl. No. 12/880,889 dated Sep. 19, 2012.
Kim et al., 'High Brightness Light Emitting Diodes Using Dislocation-Free Indium Gallium Nitride/Gallium Nitride Multiquantum-Well Nanorod Arrays', Nano Letters, vol. 4, No. 6, 2004, pp. 1059-1062.
Communication from the Korean Patent Office re 10-2012-7009980, dated Apr. 15, 2013, 6 pages.
USPTO Office Action for U.S. Appl. No. 12/569,841 dated Mar. 26, 2013.
USPTO Office Action for U.S. Appl. No. 12/749,466 dated Jul. 3, 2012.
Uspto Notice of Allowance for U.S. Appl. No. 12/936,238 dated Apr. 16, 2013.
USPTO Office Action for U.S. Appl. No. 13/019,897 dated Jan. 16, 2013.
USPTO Office Action for U.S. Appl. No. 13/328,978 dated May 15, 2013.
USPTO Office Action for U.S. Appl. No. 13/465,976 dated Dec. 20, 2012.
Benke et al., 'Uncertainty in Health Risks from Artificial Lighting due to Disruption of Circadian Rythm and Melatonin Secretion: A Review', Human and Ecological Risk Assessment: An International Journal, vol. 19, No. 4, 2013, pp. 916-929.
Hanifin et al., 'Photoreception for Circadian, Neuroendocrine, and Neurobehavioral Regulation', Journal of Physiological Anthropology, vol. 26, 2007, pp. 87-94.
International Search Report & Written Opinion of PCT Application No. PCT/US2013/029453, dated Jul. 25, 2013, 11 pages total.
http://www.philipslumileds.com/products/luxeon-flash, 'LUXEON Flash', Philips Lumileds, Aug. 8, 2013, pp. 1-2.
Rea et al., 'White Lighting', COLOR Research and Application, vol. 38, No. 2, Sep. 3, 2011, pp. 82-92.
USPTO Office Action for U.S. Appl. No. 12/569,841 dated Aug. 13, 2013, 21 pages.
USPTO Office Action for U.S. Appl. No. 12/861,765 dated Sep. 17, 2013, 10 pages.

| Characteristics of Model |
|---|
| Rays emitted at all angles |
| Upon impact with a sidewall: extraction /specular reflection |
| Source point integrated over-p contact area |
| Effects: - Multiple bounces<br>- Fresnel reflectivity at dielectric and metal interfaces (all TE)<br>- Substrate absorption<br>- Cavity effects if needed |
| Chip geometry includes n-pad |
| Rough surfaces are not treated |

Figure 1

Square
Cex = 46.6753
Abs = 20.0083
p  = 9.874
n = 4.8617
gs = 2.8166
Guided = 15.5124

Pyramid
Cex = 71.1123
Abs = 9.8234
p  = 8.9318
n = 4.1338
gs = 3.5431
Guided = 2.0483

Triangle
Cex = 59.3599
Abs = 12.6936
p  = 10.1479
n = 4.8378
gs = 3.3204
Guided = 9.3235

Tetragon
Cex = 79.7903
Abs = 6.5353
p  = 7.222
n = 3.932
gs = 1.7238
Guided = 0.3239

Main contributions: p-metal and substrate absorption, with similar magnitudes

Figure 4

GALLIUM AND NITROGEN CONTAINING TRILATERAL CONFIGURATION FOR OPTICAL DEVICES

CROSS-REFERENCE TO RELATED APPLICATION

This application claims priority to U.S. Provisional Application No. 61/526,136, filed Aug. 22, 2011, which is incorporated by reference in entirety herein.

BACKGROUND OF THE INVENTION

This disclosure relates generally to lighting techniques. More specifically, embodiments of the disclosure include techniques for manufacturing optical devices, such as light emitting diodes (LEDs) using a separation process of thick gallium and nitrogen containing substrate members, such as GaN configured in polar, non-polar or semi-polar crystalline orientations or others. In some embodiments, the gallium and nitrogen containing substrate is configured in a trilateral shape. In other embodiments, the starting materials can include polar gallium nitride containing materials. Embodiments of the disclosure can be applied to applications such as white lighting, multi-colored lighting, general illumination, decorative lighting, automotive and aircraft lamps, street lights, lighting for plant growth, indicator lights, lighting for flat panel displays, other optoelectronic devices, and the like.

Solid state lighting techniques are known. Solid state lighting relies upon semiconductor materials to produce light emitting diodes. At first, red LEDs were demonstrated and introduced into commerce. Red LEDs use Aluminum Indium Gallium Phosphide or AlInGaP semiconductor materials. Most recently, Shuji Nakamura pioneered the use of InGaN materials to produce LEDs emitting light in the blue color range for blue LEDs. High intensity UV, blue, and green LEDs based on GaN have been proposed and even demonstrated with some success. Efficiencies have typically been highest in the UV-violet, dropping off as the emission wavelength increases to blue or green. Unfortunately, achieving high intensity, high-efficiency GaN-based green LEDs has been particularly problematic. Additionally, GaN based LEDs have been costly and difficult to produce on a wide-scale in an efficient manner. Although highly successful, solid state lighting techniques must be improved for full exploitation of their potential. These and other limitations may be described throughout the present specification and more particularly below.

BRIEF SUMMARY OF THE INVENTION

The present advances provide a method of shaping a gallium and nitrogen containing substrate structure. The method includes providing a gallium and nitrogen containing substrate having a front region and a back region. The backside region comprises a plurality of p-type regions. The method further includes forming n-type regions, which can be formed within the front region or the back region. The method also includes subjecting a first street region between at least a first portion of a first die and a second die provided on the front region to at least a first saw process configured using a rotating blade structure having a tip region extending from a base region. The tip region is characterized by an angle of about 65 degrees (other angles are possible as well) and less to cause formation of a first trench region within the street region. Depending on the application, the angle for the tip region can be larger as well. The first trench region has a corresponding angle of about 65 degrees and less. The method also includes subjecting a second street region between at least a second portion of the first die and the second die provided on the front region to at least a second saw process configured using rotating blade structure having a tip region extending from a base region. The tip region is characterized by an angle of about 65 degrees and less to cause formation of a second trench region within the street region. The second trench region has a corresponding angle of about 65 degrees and less. The method additionally includes subjecting a third street region between at least a third portion of the first die and the second die provided on the front region to at least a third saw process configured using a rotating blade structure having a tip region extending from a base region. The tip region is characterized by an angle of about 65 degrees and less to cause formation of a third trench region within the street region. The third trench region has a corresponding angle of about 65 degrees and less. The method also includes removing a chip having a first exposed region from a portion of the first trench region, second exposed region from a portion of the second trench region, and a third exposed region from a portion of the third trench region. The first exposed region, the second exposed region, and the third exposed region form a tetragonal shaped structure or an extruded tetragonal shaped structure. In a specific embodiment, a lateral region of the substrate is electrically coupled to n-type and p-type contacts.

According to another embodiment, the present advances provide an optical device. The device includes a gallium and nitrogen containing substrate material. The device also includes a selected active region area of less than 65 microns square formed overlying the substrate. In certain embodiments, the selected active region area can be greater than 65 micron square. Depending on the application, the active region area can be greater than 65000 microns square as well. The device has an extraction efficiency characterized by a maximum emission region for the selected active region area substantially free from orthogonal angles.

According to yet another embodiment, the present advances provide a method of separating small gallium and nitrogen containing chips from a substrate structure. The method includes providing a patterned substrate comprising a backside region. The patterned substrate includes a plurality of chips. Each of the chips has a backside surface region. The method also includes coupling the backside region of the substrate to a polymeric tape substrate to hold the patterned substrate on the tape substrate. Additionally, the method includes subjecting the patterned substrate to a saw process to partially cut between at least two of the chips from the patterned substrate. The saw process is configured to cause a sheer force such that one or more the chips can detach from the tape substrate if the blade penetrates through an entirety of a thickness of the substrate. The method additionally includes removing the partially cut patterned substrate attached to the polymeric tape from the saw process. The method also includes breaking the patterned substrate to detach the chip.

According to yet another embodiment, the present advances provide an optical device. The device includes a gallium and nitrogen containing substrate structure comprising a base region and at least six sides excluding the base region configured in a non-orthogonal spatial manner to the base. The device also includes an active region configured to one or more mirror structures to cause a selective emission of electromagnetic radiation.

The present method and structure provides certain benefits:
A model has predicted extraction efficiency and losses for a smooth chip;
Tetragonal shape is desirable;

Tetra chip geometry: keeping some vertical sidewall is useful. There is some design freedom both for height of sidewalls and lateral dimensions;

Cavity effects boost extraction efficiency by a few %.

Various benefits are achieved over pre-existing techniques using the present advances. Depending upon the embodiment, the present apparatus and method can be manufactured using conventional materials and/or methods according to one of ordinary skill in the art. In a specific embodiment, the present advances provide for a method for singulation of thick c-plane GaN wafers into a trilateral-shaped LED chips defined by sidewalls. For example, the sidewalls are characterized by an orientation of approximately 10-1-1. In one or more embodiments, the m-plane is a natural break plane, which easily cleaves, in the case of c-plane GaN wafers, and therefore, a singulation process involving breaking exclusively or predominately along a set of m-plane orientations will have a higher yield than a process involving breaking along a-plane orientations.

In a specific embodiment, the present advances provide for trilateral pyramid shaped chips characterized by improved light extraction when compared to conventional square- or rectangle-shaped chips, due to an increase in the per-pass probability of escape of in-plane emission arising from a decrease in the probability of total internal reflection at the sidewalls. In a specific embodiment, the trilateral shaped chip is configured using conventional saw and scribe techniques. Of course, there can be other variations, modifications, and alternatives, such as laser based dicing. Depending upon the embodiment, one or more of these benefits may be achieved. These and other benefits may be described throughout the present specification and more particularly below.

The present advances achieve these benefits and others in the context of known process technology. However, a further understanding of the nature and advantages of the present advances may be realized by reference to the latter portions of the specification and attached drawings.

BRIEF DESCRIPTION OF THE DRAWINGS

FIG. 1 depicts a method of a simulation method for shaped chip;

FIGS. 3 and 4 are illustrations of conventional and present shaped chip;

DETAILED DESCRIPTION OF THE INVENTION

Figure 2:
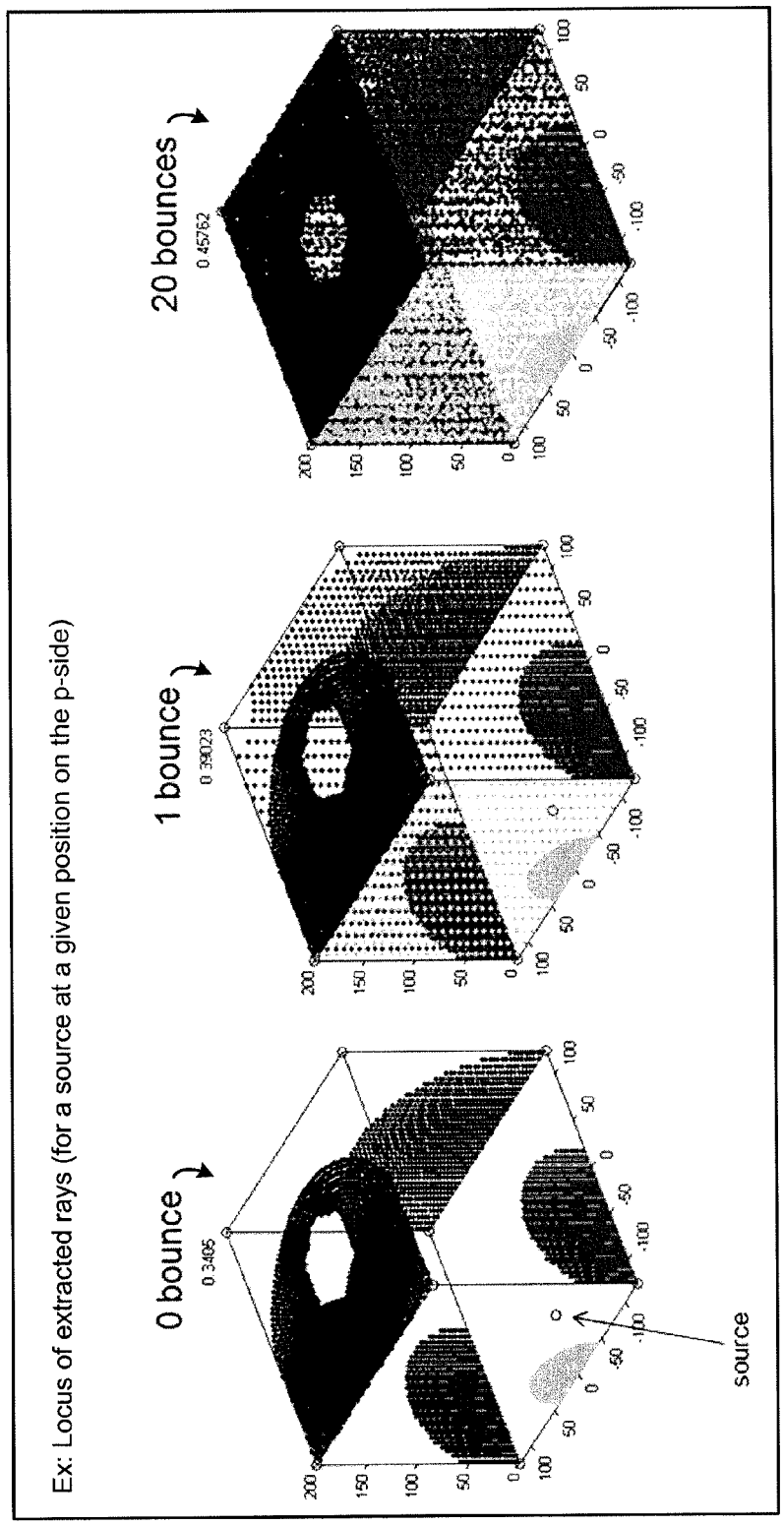
FIG. 2 is an illustration of a simulation method for a conventional cubic chip.

According to the present disclosure, techniques generally related to lighting are provided. More specifically, embodiments of the disclosures include techniques for manufacturing optical devices, such as light emitting diodes (LEDs) using a separation process of thick gallium and nitrogen containing substrate members, such as GaN configured in non-polar or semi-polar crystalline orientations or others. In some embodiments, the present disclosure provides tetragonal shaped chips with non-orthogonal sidewalls. In other embodiments, the starting materials can include polar gallium nitride containing materials, and others. Merely by way of example, the embodiments can be applied to applications such as white lighting, multi-colored lighting, general illumination, decorative lighting, automotive and aircraft lamps, street lights, lighting for plant growth, indicator lights, lighting for flat panel displays, other optoelectronic devices, and the like.

Light extraction strategies have historically relied on three-dimensional chip shaping with non-orthogonal chip sidewalls, as described in "High-power truncated-inverted-pyramid (AlxGal-x)0.5In0.5P/GaP light emitting diodes exhibiting >50% external quantum efficiency", Krames et al., Appl. Phys. Lett. vol. 75, No. 16, 18 Oct. 1999, which is incorporated by reference herein for all purposes. or two-dimensional designs where the light generating active layer is bounded by a low-loss reflector and a light emitting/scattering interface, as discussed in the article "30% external quantum efficiency from surface textured, thin-film light-emitting diodes", Schnitzer et al., Appl. Phys. Lett. 63 (16), 18 Oct. 1993, which is incorporated by reference herein for all purposes.

Three-dimensional shaping approaches have the disadvantage in that they are difficult to scale up in light output. That is, to generate more light from a single chip, the chip generally must be made larger in size. Making these three-dimensional chips larger must either result in the use of thicker substrate wafers, or a decrease in the aspect ratio of the chip. Thicker substrates are typically not feasible from a cost standpoint. In addition, absorption losses will often increase. On the other hand, if the aspect ratio is not preserved, the light extraction efficiency is greatly diminished as a result of mirror loss and/or increased absorption by the substrate.

Two dimensional, textured thin film devices have been successful, particularly for high output power devices. However, these chips are fundamentally limited as to their ultimate light extraction efficiency due to the need for multiple reflections off loss generating reflectors as well as multiple traverses across light absorbing nitride layers. These losses are further significantly multiplied when phosphor is applied in existing down-conversion systems. Phosphor particles, often being scattering sites, will redirect a significant portion of both down-converted (yellow spectrum) and unconverted light back into the GaN, where losses often will again take place.

In a specific embodiment, the present disclosure provides a design (e.g., the rectangular parallel-piped) having improved light extraction characteristics. That is, the present device and related methods provides at least three spatial dimensions and also provides for a scattering surface opposite a reflector contact.

Additionally, the present devices have high efficiency at high current density. In a preferred embodiment, the devices may be employed in small chips in arrays. These two factors allows for 'three dimensional' chip designs with a favorable (near 1:1) aspect ratio while still emitting more light per chip. This is of course because the design and method scales current density instead of active region area. This opens up the possibility for high light output per chip while still using reasonable substrate wafer thicknesses.

Three-dimensional shaped structures with non-orthogonal sidewalls such as the truncated inverted pyramid chip or the ATON or NOTA chip have been employed previously. However, these chips employ a non-native substrate (e.g., SiC for ATON devices) or a wafer fused substrate which serves as the light extracting medium, as described in "Hexagonal pyramid shaped light-emitting diodes based on ZnO and GaN direct wafer bonding", Mural et al, Appl. Phys. Lett. 89, 171116 (2006). The present shaped chips do not involve shaping of any material other than GaN.

Additionally, existing chip designs have employed shapes with square bases. Squares, and even hexagons, have non-obvious limitations with respect to light extraction. One aspect of the embodiments involves our belief that trilateral pyramid chips, resulting in tetrahedral chip shapes, are likely to be more efficient light extractors than traditional quadrilateral or even hexagonal pyramid shaped chips. The reasoning that tetragonal shaped chips are more efficient extractors, as well as additional background with respect to the embodiments, is outlined more specifically below.

In a specific embodiment, the present method and structure provides that, in the absence of scattering elements, a minimum of 30% of all light is lost for square based chips (for) $\Theta c=30°$, regardless of the employment of angled sidewalls. This is a consequence of the fact that the angle of incidence of the horizontal component behaves as $\Theta n+1=|90°-\Theta n|$ for square based chips. On the other hand, the horizontal component of light rays in an equilateral triangular chip will always arrive at an incidence of 30° or less on either the first or second reflection (following $\Theta n+1=|60°-\Theta n|$ for the equilateral triangle base) Because the critical angle for GaN ($n\approx 2.56$) to silicone ($n=1.41$) is approximately 32°, the equilateral triangle is particularly advantageous. This is not to say that all light is emitted for tetragonal shaped chips on the first or second reflection, because the vector defined by both the horizontal and vertical components must be incident at an angle below $\Theta c$. While the vertical and horizontal components, taken separately, will oscillate between $\Theta>30$ and $\Theta<30$ with each reflection off a sidewall, some rays will exist for which the vertical and horizontal component are not both simultaneously <30 (though this also is mitigated by reflections off the base face reflector contact, which alters the vertical component but not the horizontal component). Furthermore, both the horizontal and vertical components of a ray can of course be less than $\Theta c$ but the angle of incidence greater than $\Theta c$. The situation in three dimensions becomes complex, requiring ray trace simulations or preferably empirical evaluation. In certain cases, the tetragonal shape can be superior to the quadrilateral pyramid.

Figure 6:
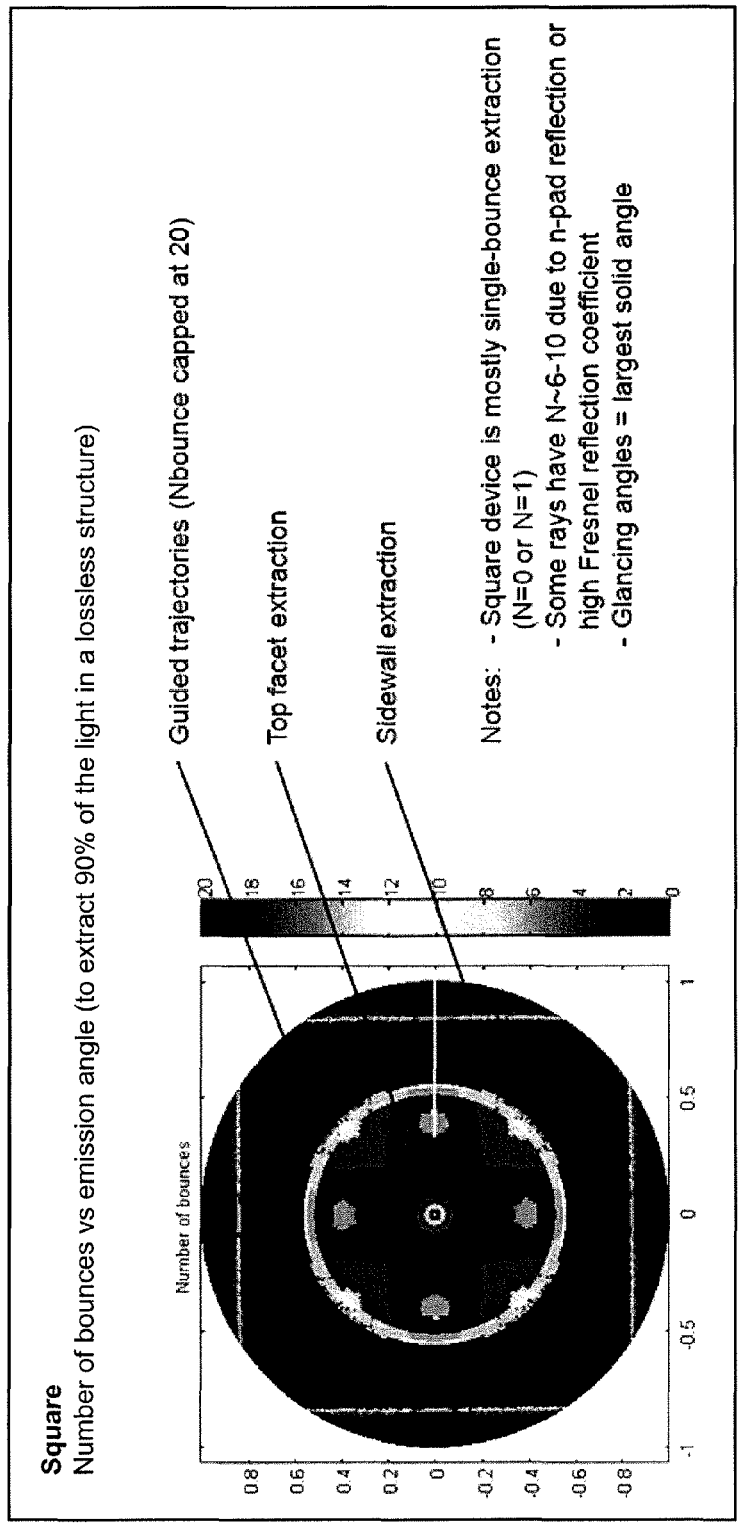

As will be further supported below, a 5~10% increase in light output has been observed for triangular based chips vs. square based chips with straight sidewalls. By the same argument of the previous paragraph, it is believed that angled sidewalls, particularly angled sidewalls where the sidewall angle is equal to $\Theta c$ (as shown in FIG. 6) will exhibit further significant enhancement.

In addition to the enhanced light extraction of this chip design, it is also believed that this design will interact very favorably with phosphor systems for white light generation. High chip light extraction is again desirable for light 'reintroduced' to the chip from phosphor emission (or scattering, reflection, etc.)—both textured thin-film devices and 3D based devices can exhibit high light extraction. However, in contrast to textured thin-film devices, the lack of a highly effective scattering surface (the basis for 'ergodicity') should work to the advantage of the tetragonal chip vis-à-vis the phosphor interaction. The reasoning for this is as follows.

While all light incident on the face of a GaN sidewall will enter the chip (except for Fresnel reflection) it must do so with an entrance angle below $\Theta c$. In the absence of randomized redirection, the light ray cannot enter a non-escaping mode trajectory, because of the symmetry of Snell's law with respect to the direction of travel of the ray. In short, if a light ray is able to enter the chip, it must be able to exit the chip. Furthermore, it will do so with minimal reflections on the loss producing reflector contact. By contrast, light entering ergodic chips lose all information as to their entrance trajectory, and must therefore rely on multiple reflections before escaping again. In this view, at the phosphor system level it may prove beneficial to remove all roughening from the chip. In various embodiments, spacing between various chips are optimized for placement of different phosphors.

Another benefit is the ability to change die-to-die spacing at will, to find optimal configurations for interactions with different phosphor and phosphor systems conditions (e.g., phosphor size). This is a limitation of large conventional 'waffle' chips.

The lack of dependence on highly effective scattering surfaces is another advantage of this chip design. If we are using shaped chips, successful application of scattering is likely not a concern. That is, embodiments can be implemented without substantial concern to various surface processing techniques, which can be difficult and cumbersome to apply.

As for the practical method of manufacturing said tetrahedral chip, dicing with a beveled blade has been performed. As an example, the present method using dicing can be performed using a conventional saw. In another example, the blade angle used may result in sidewalls sloped 30° away from vertical. From the fabrication process perspective, there are additional advantages to the tetragonal chip.

The first advantage involves the feasibility of dicing. Initial dicing observations have shown that dicing along a planes occasionally produces cracks propagating out at 60° angles (i.e. along m planes). However, when dicing proceeds along m planes, no such cracking is observed along a planes. It appears that m planes are to some degree easier to dice along. In some embodiments, it is only practical to produce triangular (or hexagonal) based chips if dicing is limited to only m planes. For example, by cutting along m planes, yield can be improved.

The second advantage concerns the ability to remove damage and/or further smooth the resulting angled sidewall. When dicing proceeds along the m planes, the resulting faces are at 60° with respect to horizontal (basal plane of GaN). This is only 2° less than the orientation of the {10-1-1} planes—the etch stop planes during texture etching. It is then envisioned that following dicing, a chemical etch involving heated KOH could be employed to both remove material mechanically damaged by the blade abrasives and further smooth this surface. It may be desirable to use a 62° blade to enhance this capability.

Regarding the fact that {10-1-1} are revealed by dicing tetrahedrons, it may be possible to chemically or chemical-mechanically generate these surfaces. ZnO very favorably etches chemically in this manner, exhibiting extreme selectivity between {10-1-1} and other planes (see Murai et al. above). However GaN does not have this same degree of selectivity. Nevertheless, there may be a way to integrate a mechanical sawing process coupled with KOH or other etchant to more easily produce the desired angled sidewall. Note that all advantages with respect to {10-1-1} exposed faces apply equally to hexagonal pyramids as to tetrahedrons.

Two embodiments include a vertical chip design (a truncated tetrahedron with a wirebond on top), or a laterally contacted device which allows for a full tetrahedron shape.

The tetrahedron (or any other pyramid shape) can be integrated well with certain types of substrate that have regularly spaced or non-regularly spaced defect regions. In certain embodiments, the present disclosure provides a process where dot core wafers with dots arrayed in a hexagonal lattice as opposed to the current square lattice. The pitch of the defect regions would be such that triangular based chips fit adequately between dot regions. In a specific embodiment, it is desirable to pattern the epitaxially grown layers in a manner such that defect regions are prevented from intruding into the active region.

In the above mentioned case, it may be necessary to have large streets if the defect regions are large. If this material must unavoidably be wasted, it may be beneficial from a light extraction standpoint to dice the wafers epi side up with a beveled blade. The epi area is less than that of the opposite substrate face. This gets to be a more complex light extraction scenario, but likely a very advantageous one, depending on the angle of the sidewall. This could be an approach that enables light extraction directly into air ($\Theta c \approx 23°$.

While the discussion has thus far focused on tetrahedral faces composed of equilateral triangles, it may be beneficial to deviate from the 60° angle. For example, if light extraction into air is desired, where $\Theta c < 30°$, it may prove beneficial to use a beveled blade resulting in a sidewall angle of 23° from normal. In the same manner, the horizontal triangle defining the active region could simultaneously (or separately) be altered to a 46°-67°-67° triangle. Further details of the present method and device can be found throughout the present specification and more particularly below.

FIG. 1 illustrates a method of a simulation model for shaped chip. In various embodiments, simulation models are used to determine a suitable die shape in optical applications, such as illumination purposes. In simulation methodology, radiation or rays from a device, which is enclosed by one or more sidewalls, is emitted at all angles. Upon impact with one or more sidewalls, the rays are either extracted or reflected. The simulation method accounts for various types of effectives: reflection, reflection, absorption, and/or cavity effect. Various geometric shapes can be simulated along with the n-pad.

FIG. 2 is an illustration of a simulation results for a conventional cubic chip. The chip as shown in FIG. 2 is a substantially cubical device, where the light source is positioned on the p-side of the device and shown as a circle in the diagram. The diagram to the left illustrates the path of radiation emitted from the source where there is no internal reflections, and the amount of light (shown as shaded regions of on various sides of the device) extracted from the device is relatively low. The middle diagram illustrates the effect of 1 reflection. As can be seen from the middle diagram, the extra reflection is needed to allow more light to be extracted or exit from the device compared to "first pass" light alone. The diagram to the right illustrates the situation where the emitted radiation reflects 20 times. A large number of internal reflection is undesirable, as light extraction efficiency becomes poor as result of internal reflection. For example, the shaded regions on the sides of the device illustrates that light is extracted from substantially all surface areas of the device. High numbers of reflections within the device results in significant loss, as each time the light traverses the device, some portion of the light is lost. Most of the light is lost after 20 reflections. Thus, it can be seen that cubic shape is not efficient for light extraction. It is to be appreciated that an important objective of three-dimensional shaping for the device is to reduce the number of reflections or internal reflection and to allow the light emitted by the device to be extracted efficiently, as light extraction is governed by Snell's law as explained above.

Figure 3:
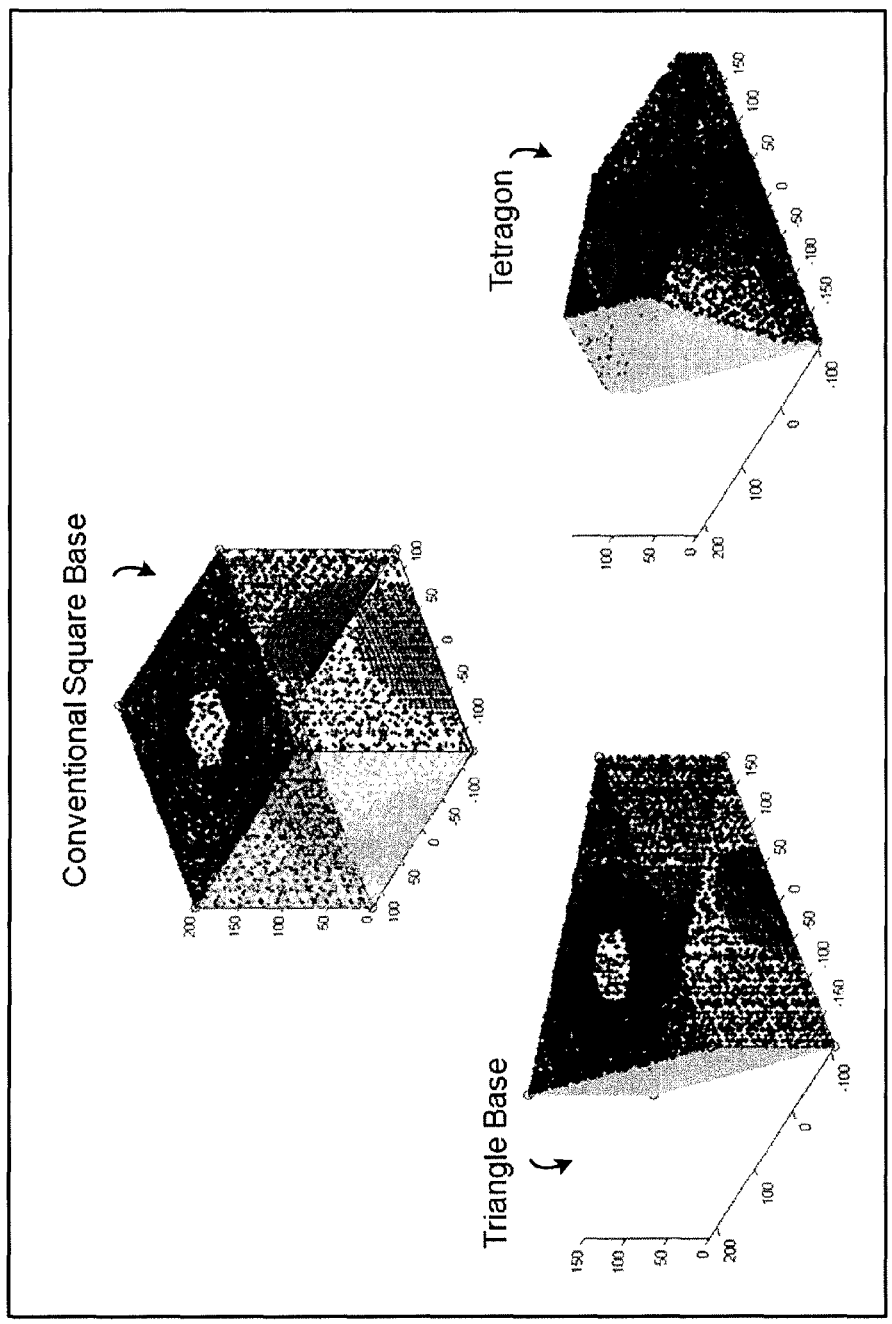

FIGS. 3 and 4 are illustrations of conventional and novel shaped chips according to some embodiments. As shown in FIG. 3, various types of three-dimensional shapes are possible. For example, top is a conventional cubic shape. As demonstrated in FIG. 2, the conventional cubic shape can be inefficient as light could reflect many times (and therefore decay) before exiting from the device. Triangular shaped devices, shown at bottom left, provides better light extraction efficiency than the cubic shaped device. It is therefore to be appreciated that various embodiments provide three-dimensional shapes, tetragon shape on the bottom right, allow for better light extraction and less internal reflection. In a preferred embodiment, the present disclosure provides for a tetragon shaped device.

FIG. 4 illustrates various characteristics of the four shapes illustrated in FIG. 3. For cubic or square shape, the chip extraction value (Cex) value is low at about 46.7% and the absorption value tends to be high at about 20%. The triangular shape is associated with a higher extraction value at about 59.4% and absorption rate at about 12.7%, and thus the triangular shape is characterized by a better light extraction efficiency compared to the cubic shape. The pyramid shape exhibits an even higher extraction rate (about 71.1%) and lower absorption rate (about 9.8%) compared to the triangular shape. Among the four different shapes, the tetragon shape exhibits the highest light extraction rate at about 79.8% and lowest absorption rate at about 6.5% among the four shapes.

Figure 5:
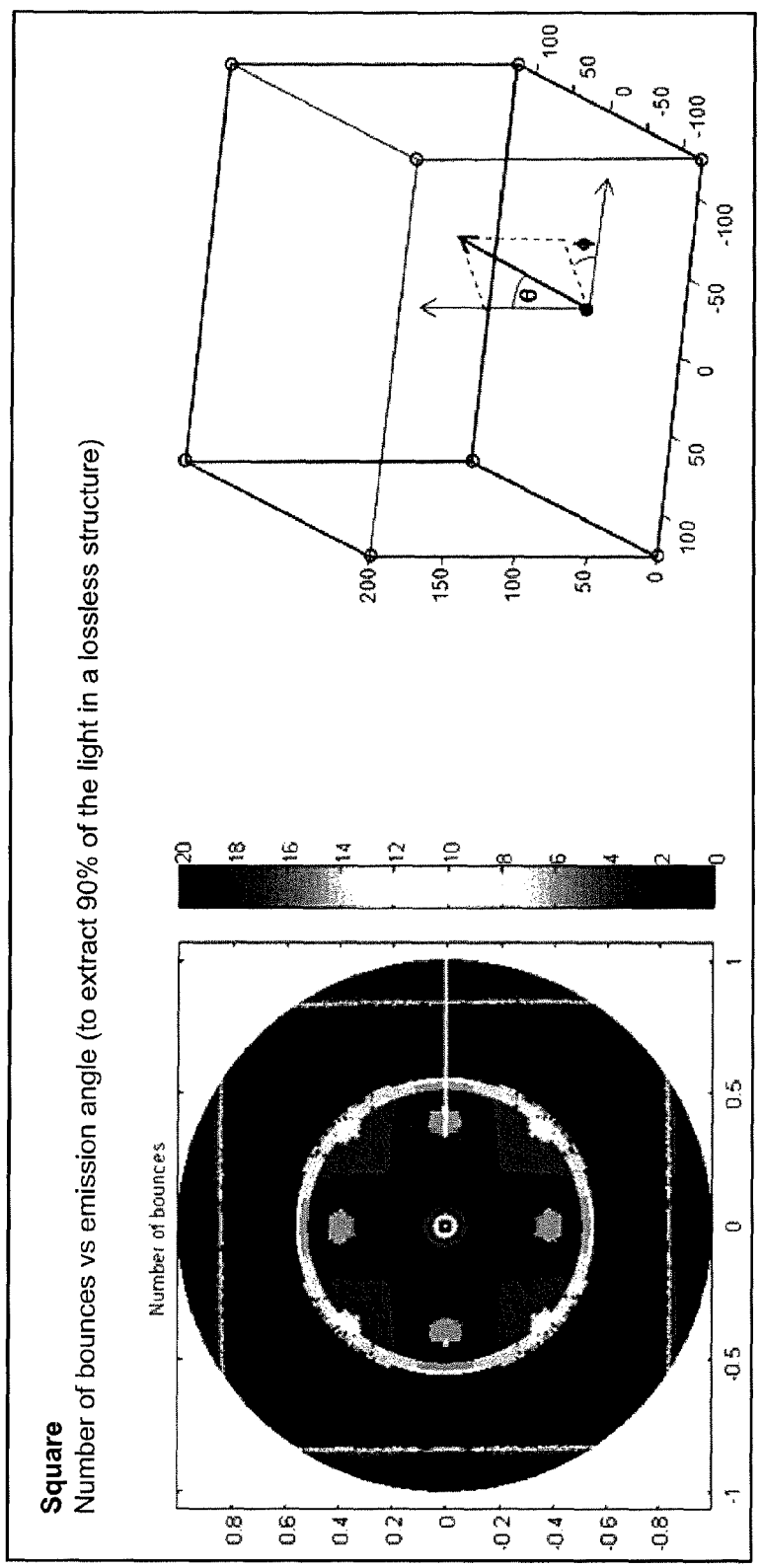
FIGS. 5 and 6 are illustrations of a conventional square chip.

FIGS. 5 and 6 are illustrations of a conventional square chip. As shown in FIG. 5, the number of times that a light ray reflects within a cubic shaped device before exiting depends on the emission angle of the ray. As explained above, the light extraction characteristic is in accordance with Snell's law. FIG. 5 illustrates that when the angle is less than 0.4 pi radians for both axes, light rays is extracted from the cubic device within a few number of reflections. However, at other angles, it typically takes many reflections, which can be over 20, before the light exits from the cubic shaped device. FIG. 6 illustrates that light extraction potential is only good at sidewalls and the top surface, where light rays can exit these surfaces at a substantially normal angle and no bouncing of light is needed.

Figure 7:
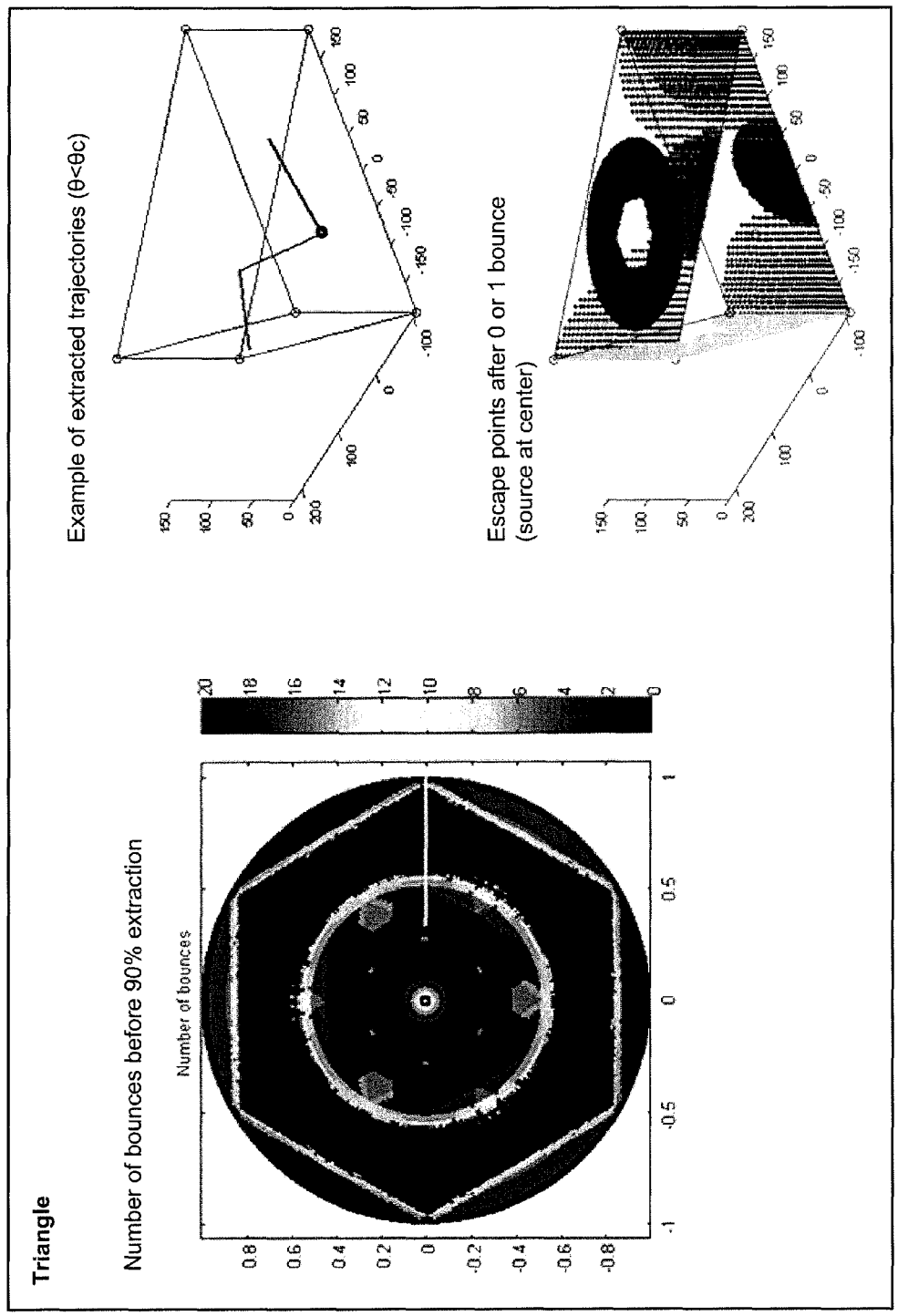
FIGS. 7 and 8 are illustrations of a triangular chip.
Figure 8:
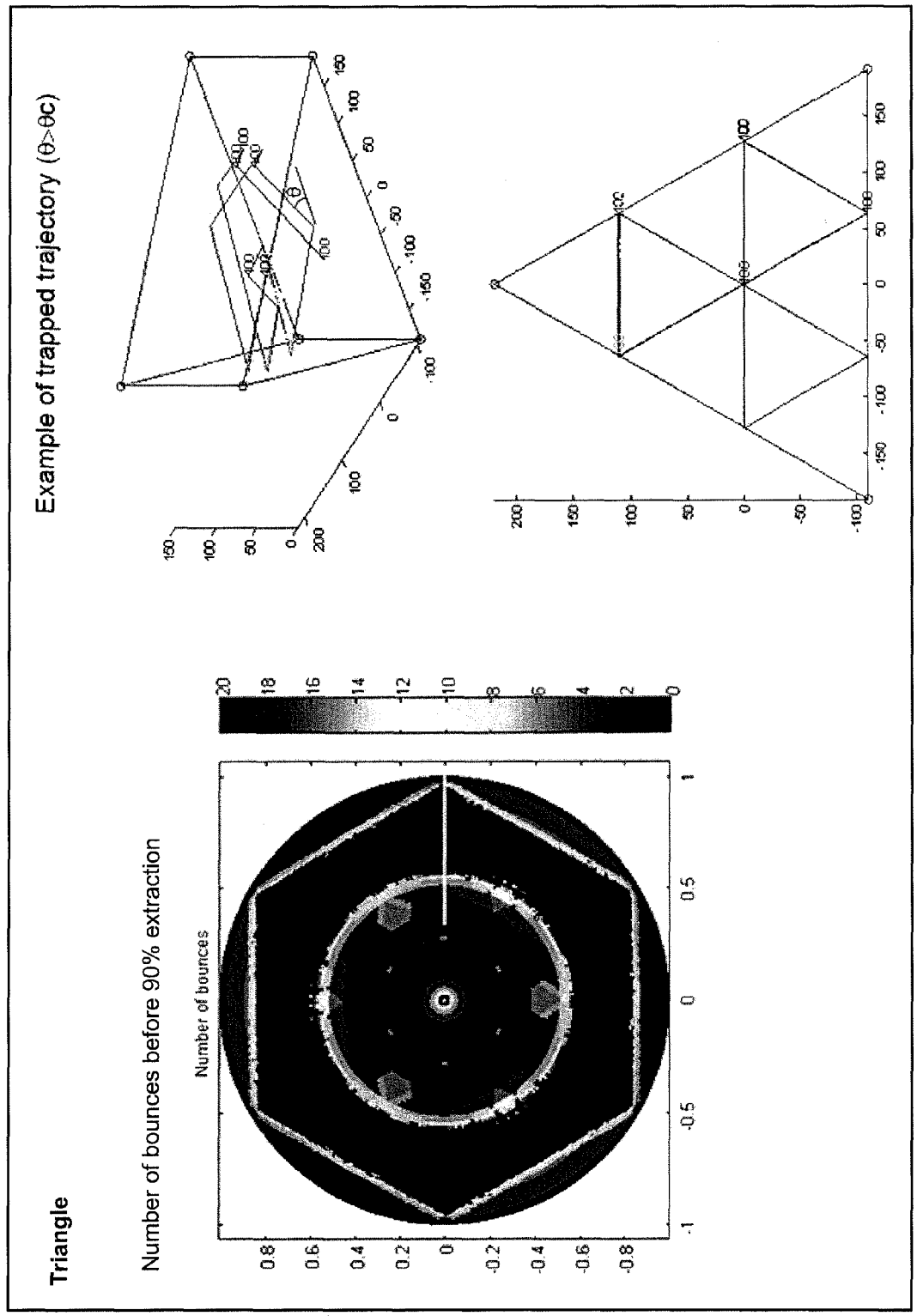

FIGS. 7 and 8 are illustrations of a triangular chip according to an embodiment. As shown in FIG. 7, when angle of light is small (e.g., less than 0.4) relative to the surface, it only takes very few reflections before light exits from the triangular shaped device. The bottom right drawing shows that much light is extracted from the triangular shaped device after one or more reflection. FIG. 8 shows that in various trajectories of light. As shown in the drawings to the right, light may exit from triangular shaped devices through various paths.

Figure 9:
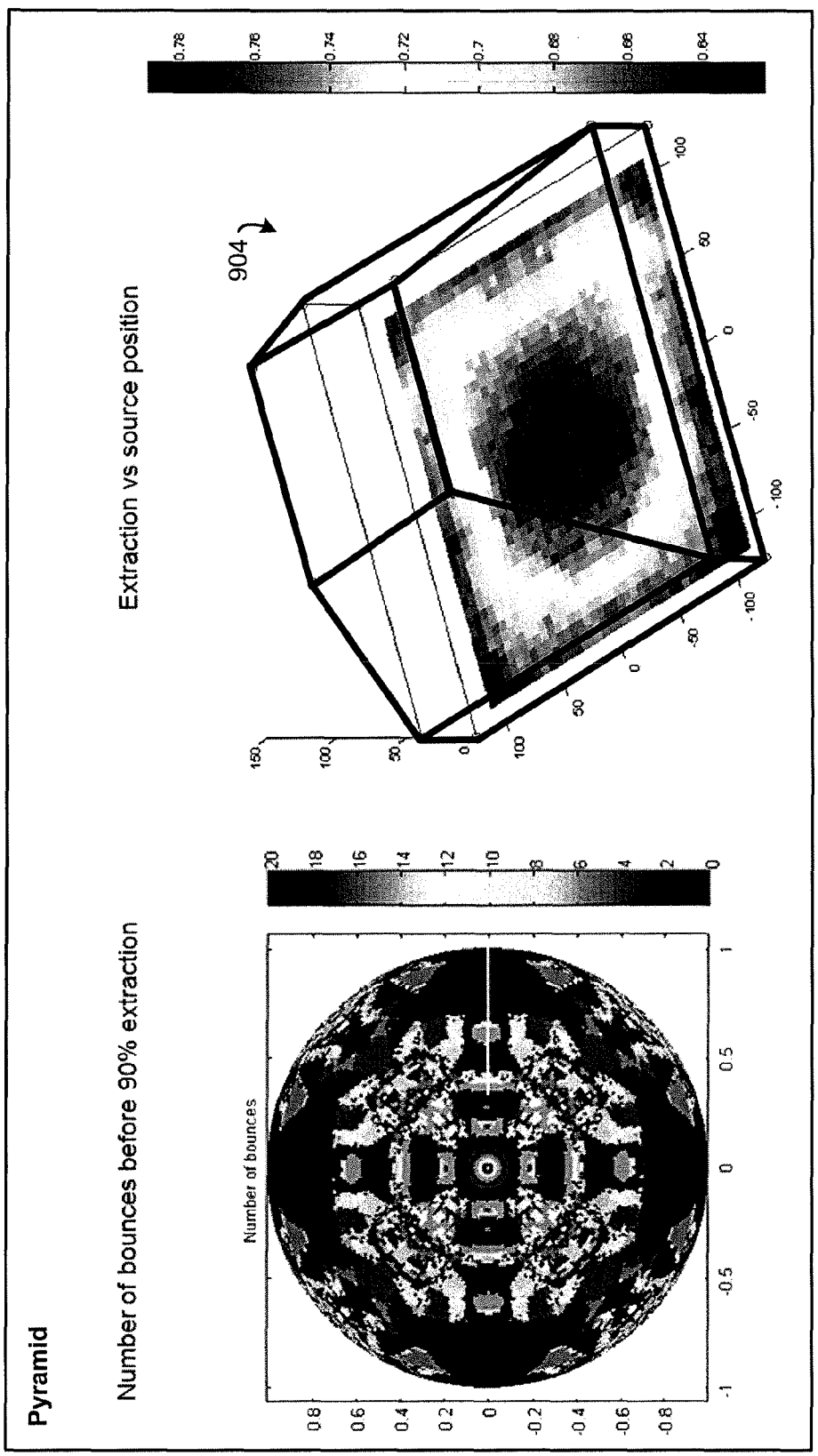
FIGS. 9 and 10 are illustrations modeling a tetragon chip.
Figure 10:
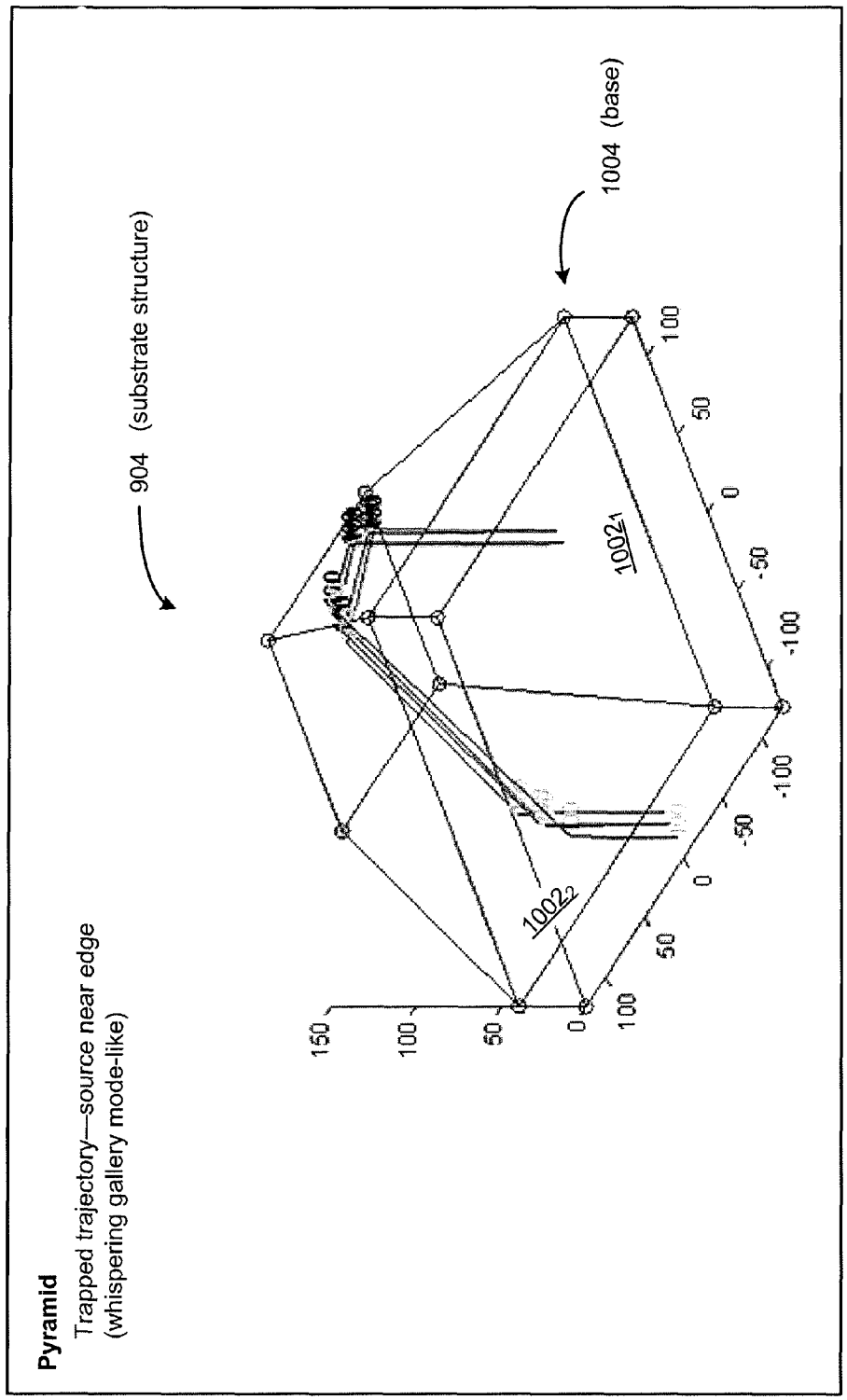

FIGS. 9 and 10 are illustrations of a pyramid shaped chip 904. FIG. 9 shows, at left, that most of the light can be extracted from various sides of the pyramid-shaped chip within a relatively few number of reflections (e.g., fewer than 10 reflections). More specifically, radiation emitted by the LED chip is able to exit from most surfaces of the pyramid and there are relatively few large areas where it requires more than 10 reflections before the radiation exits from the pyramid shaped chip. On the right side, the graph illustrates a relationship between extraction and source position. FIG. 10 shows trajectories of radiation for exiting the pyramid shaped chip 904. As shown, the pyramid shape allows radiation to exit from most sides (e.g., side 1002₁, side 1002₂) of the chip, as the trajectory angles are typically below the threshold angle where the radiation is reflected. Also shown is an exemplary base 1004, which base characteristics are further described herein.

Figure 11:
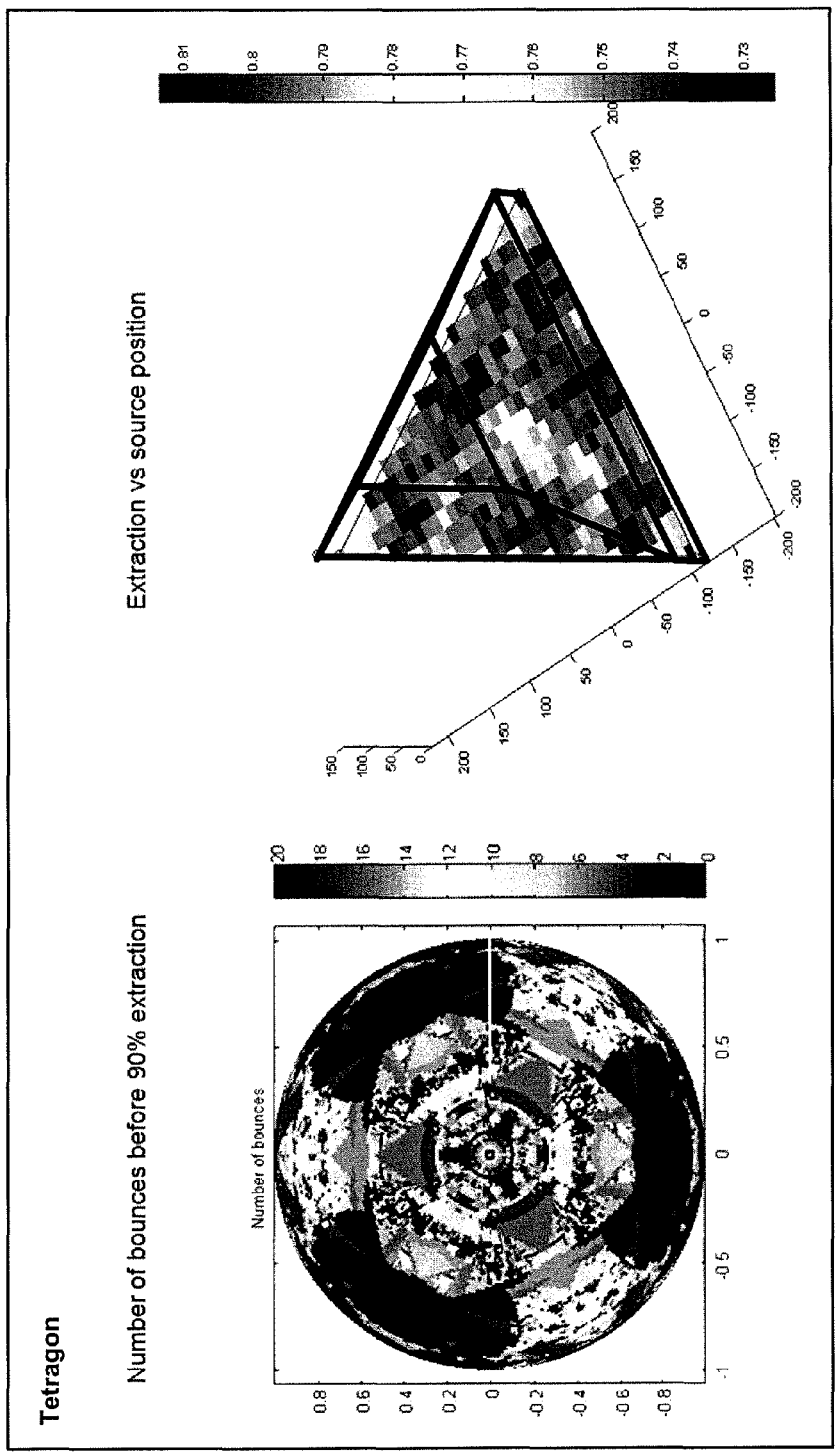
FIG. 11 is an illustration of a pyramid shaped chip.

FIG. 11 is an illustration of a pyramid shaped chip according to an embodiment. FIG. 9 shows, at left, shows that most of the light can be extracted from regions and sides of the tetragon-shaped chip within a relatively few number of reflections. Compared to the square and triangular shape illustrated in FIGS. 5-8, the tetragon-shaped chip does not contain a large area where radiation is "trapped" (i.e., internally reflected). On the right side, the graph illustrates a relationship between extraction and source position.

Figure 12:
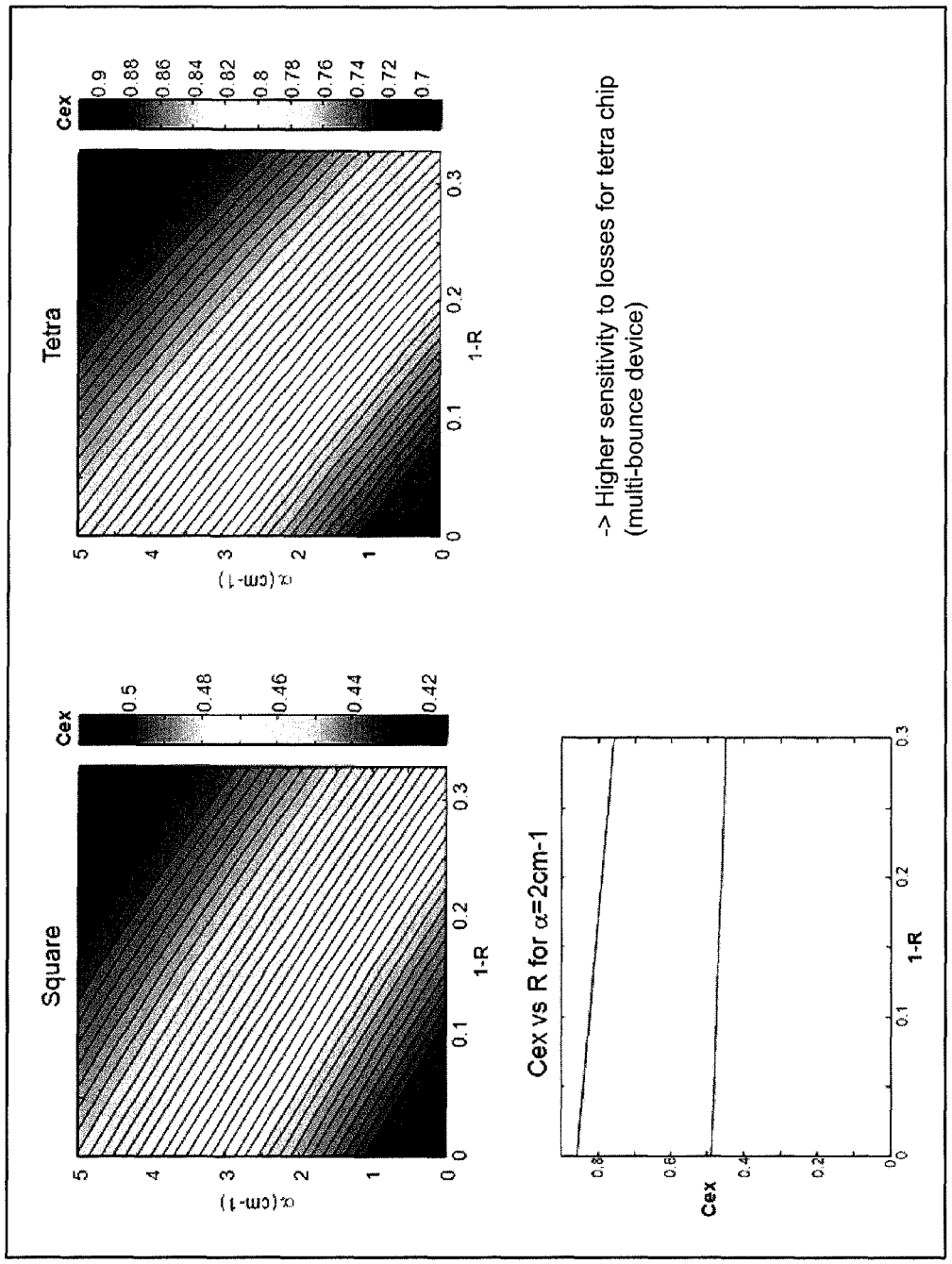
FIGS. 12 and 13 are illustrations of effects of loss for shaped chips.
Figure 13:
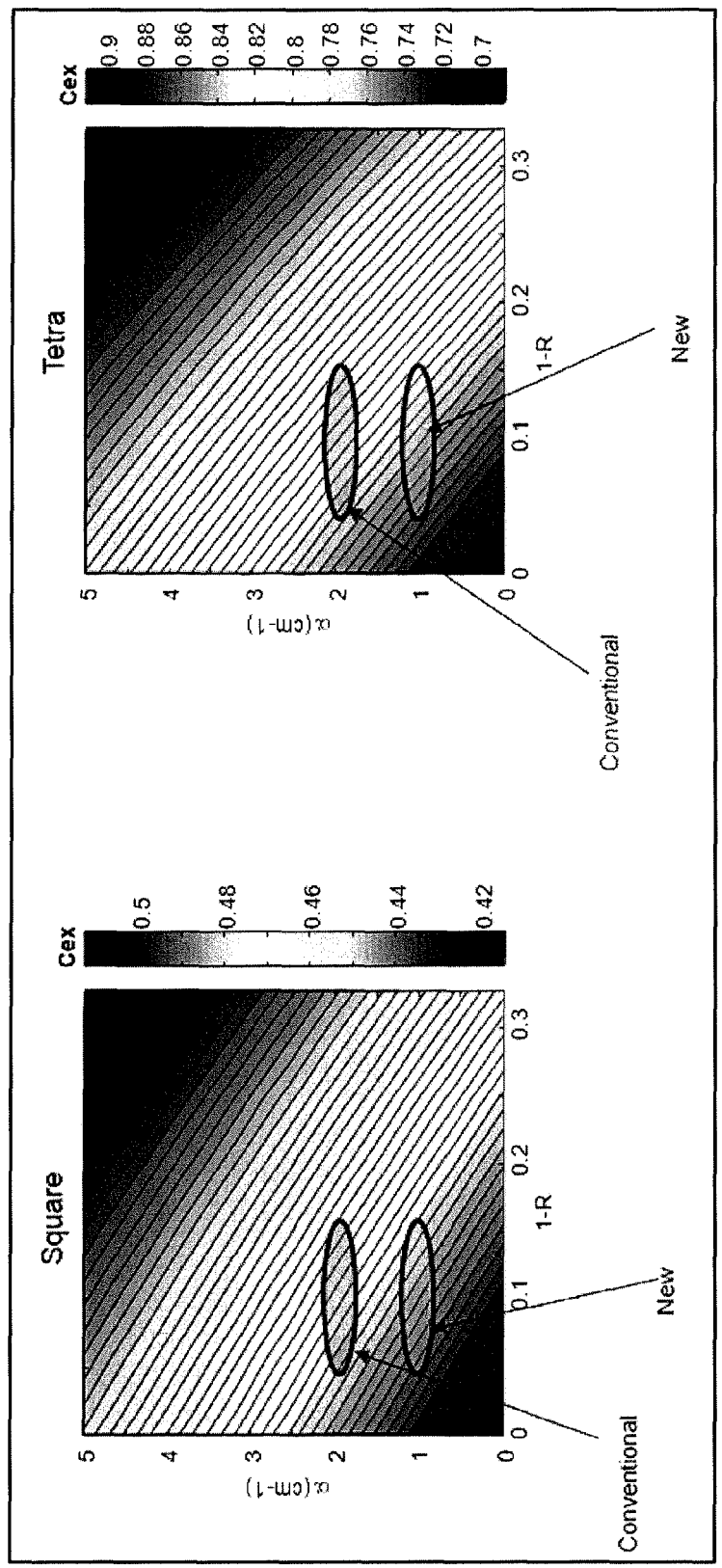

FIGS. 12 and 13 are illustrations of effects of loss for shaped chips according to some embodiments. As shown in FIG. 12, the tetragon shape is associated with less loss compared to the square shape, as demonstrated by the higher extraction index. FIG. 13 illustrates efficiencies respectively associated with conventional techniques and new techniques. In conventional techniques, the extraction efficiency is typically lower compared to embodiments. For example, in conventional techniques, a certain amount of loss is due to p-contact reflection losses.

Figure 14:
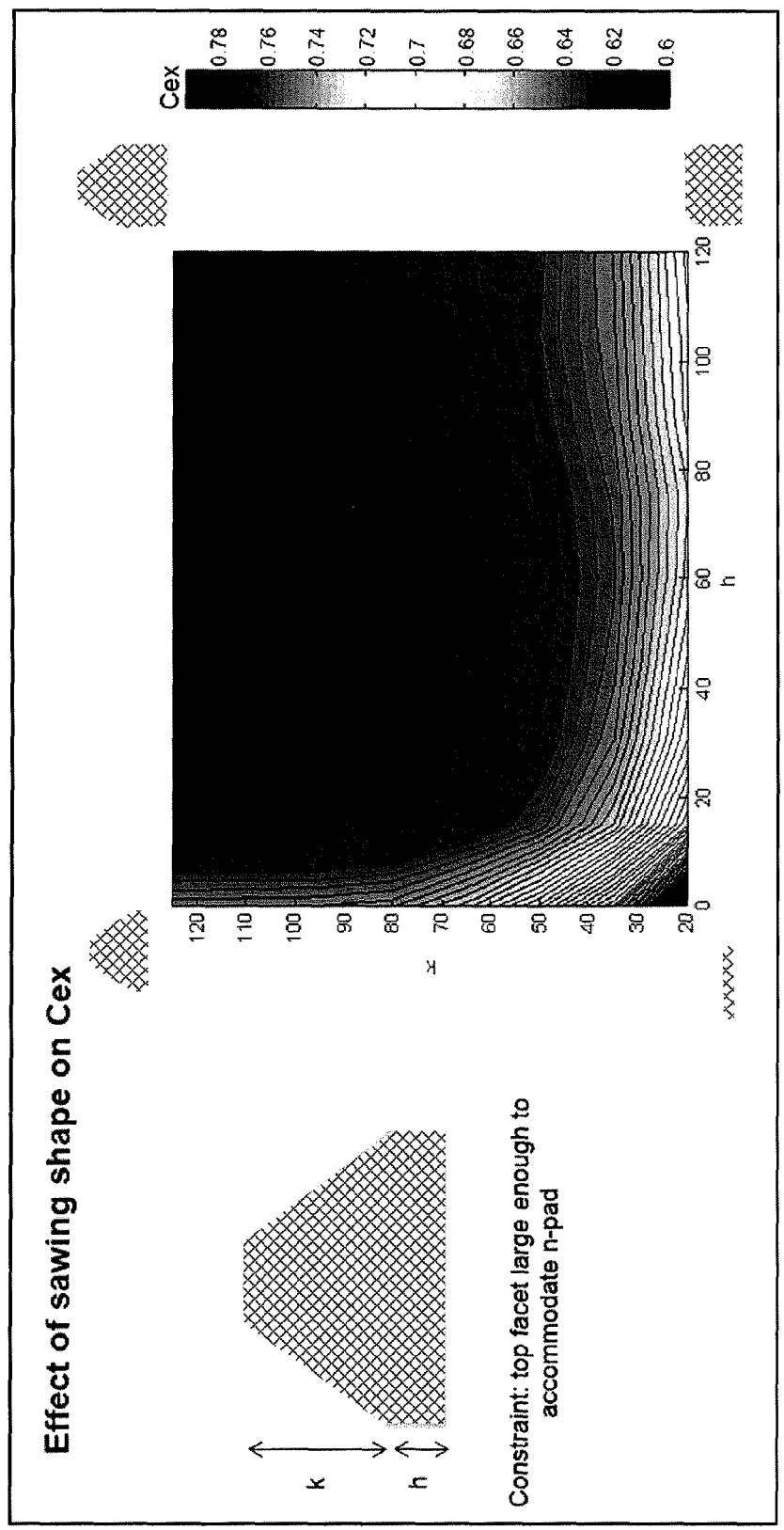
FIGS. 14 through 16 are illustrations of light extraction and impact on chip shape geometry.

FIGS. 14 through 17 are illustrations of light extraction and impact on chip shape geometry for tetragon shaped chips according to some embodiments. As shown in FIG. 14, the geometry of the tetragon shaped chip affects the extraction efficiency. For example, the existence of a vertical sidewall (at height "h" as shown) is not detrimental. For example, the vertical sidewall may offer same benefit as triangular chip: horizontal rays are extracted after 2 reflections. Depending on the application, the vertical sidewall may impact the radiation diagram and die-to-die coupling. It is to be appreciated that embodiments offer flexibility in the optimal design, which could enable optimization in terms of manufacturability, chip resistivity or other device characteristics.

Figure 15:
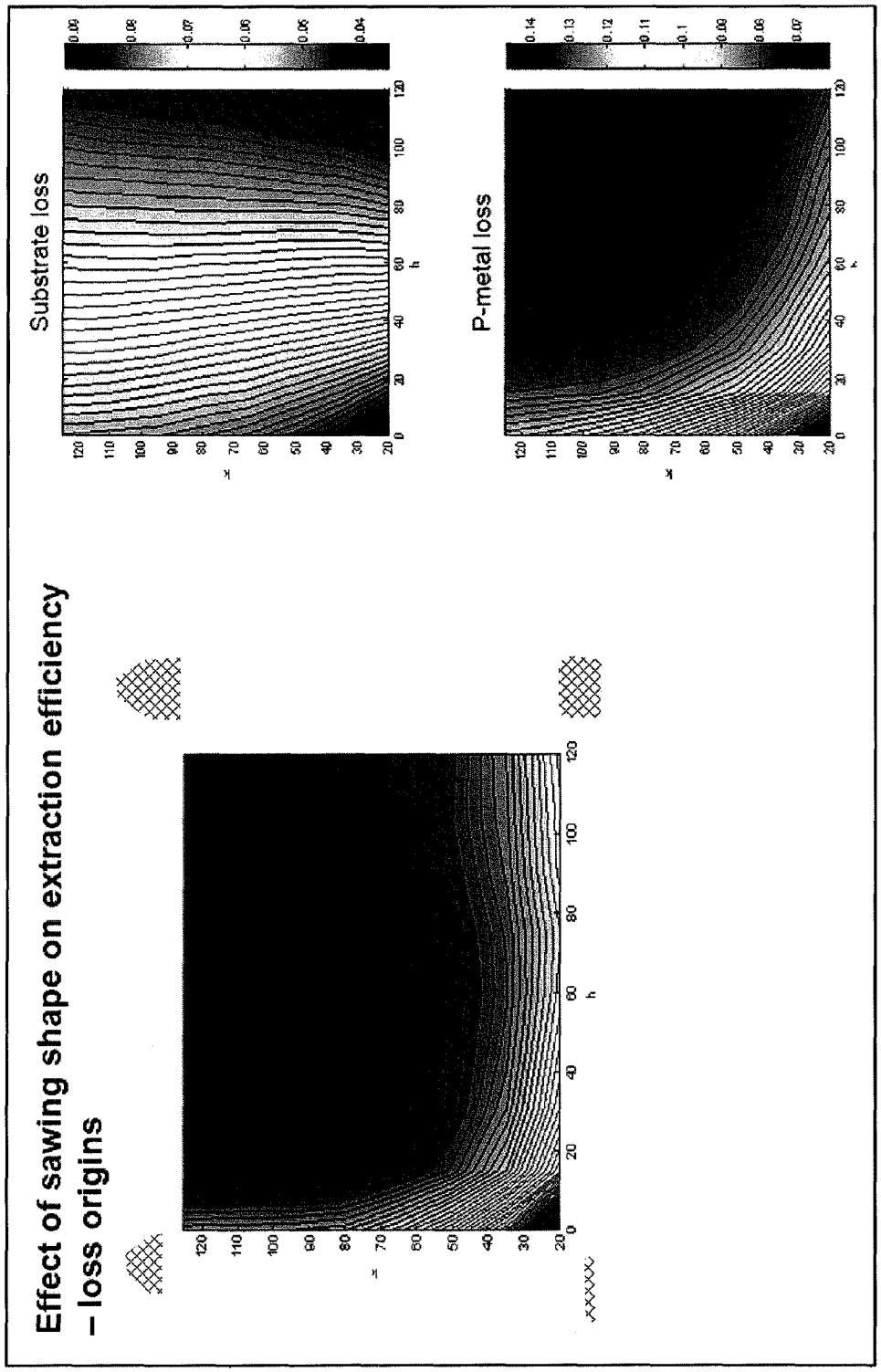
Figure 16:
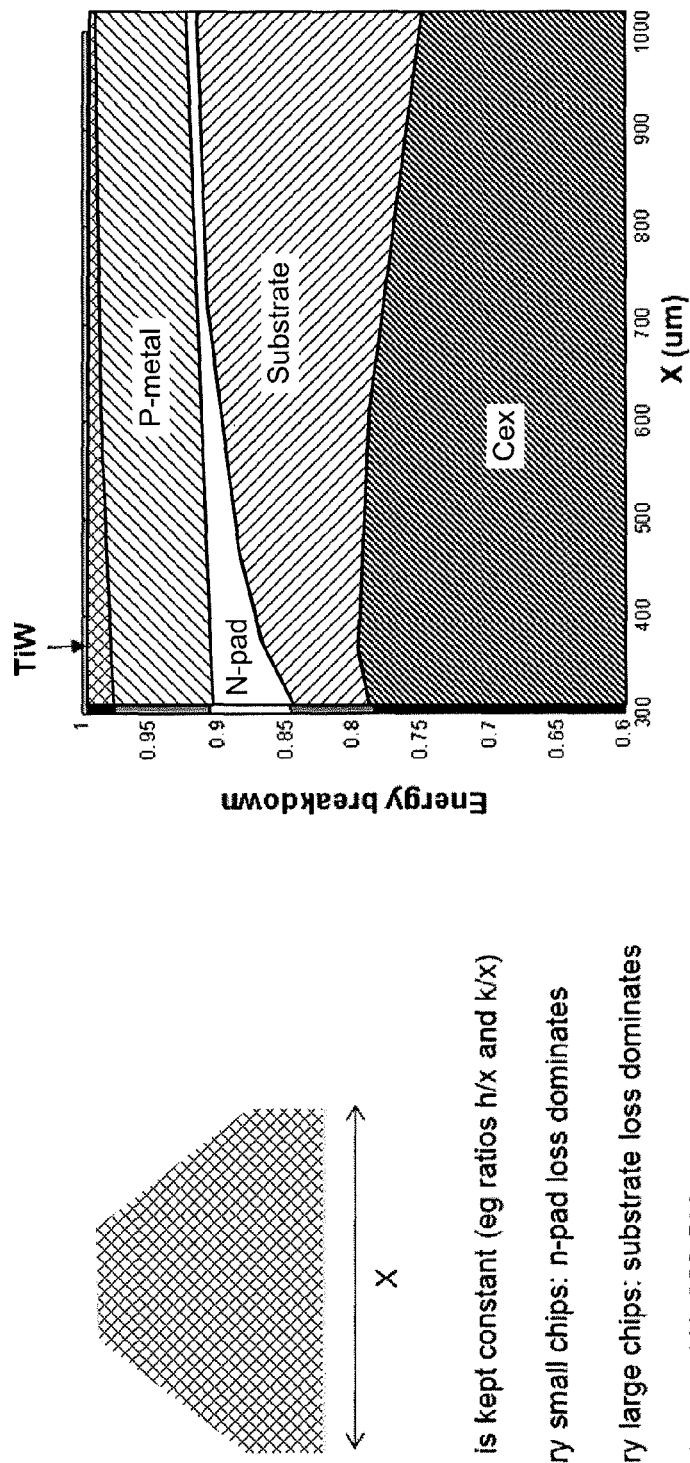

FIG. 15 illustrates effects of various aspects of the chip geometry on extraction efficiency. In general, increased chip height is associated with decreased p-metal loss, as shown, but increases substrate losses. The result is a predicted loss minima at a specific sidewall and total chip height. FIG. 16 illustrates effects of lateral dimensions of a tetragon chip affecting extraction efficiency and losses. As shown in FIG. 16, when the shape of the tetragon chip is kept constant (e.g., ratios h/x and k/x):

For very small chips: n-pad loss dominates
For very large chips: substrate loss dominates
Optimal around X=350-500 um
Note: in principle, the height value h, and the value k should be re-optimized for a given X.

Figure 17:
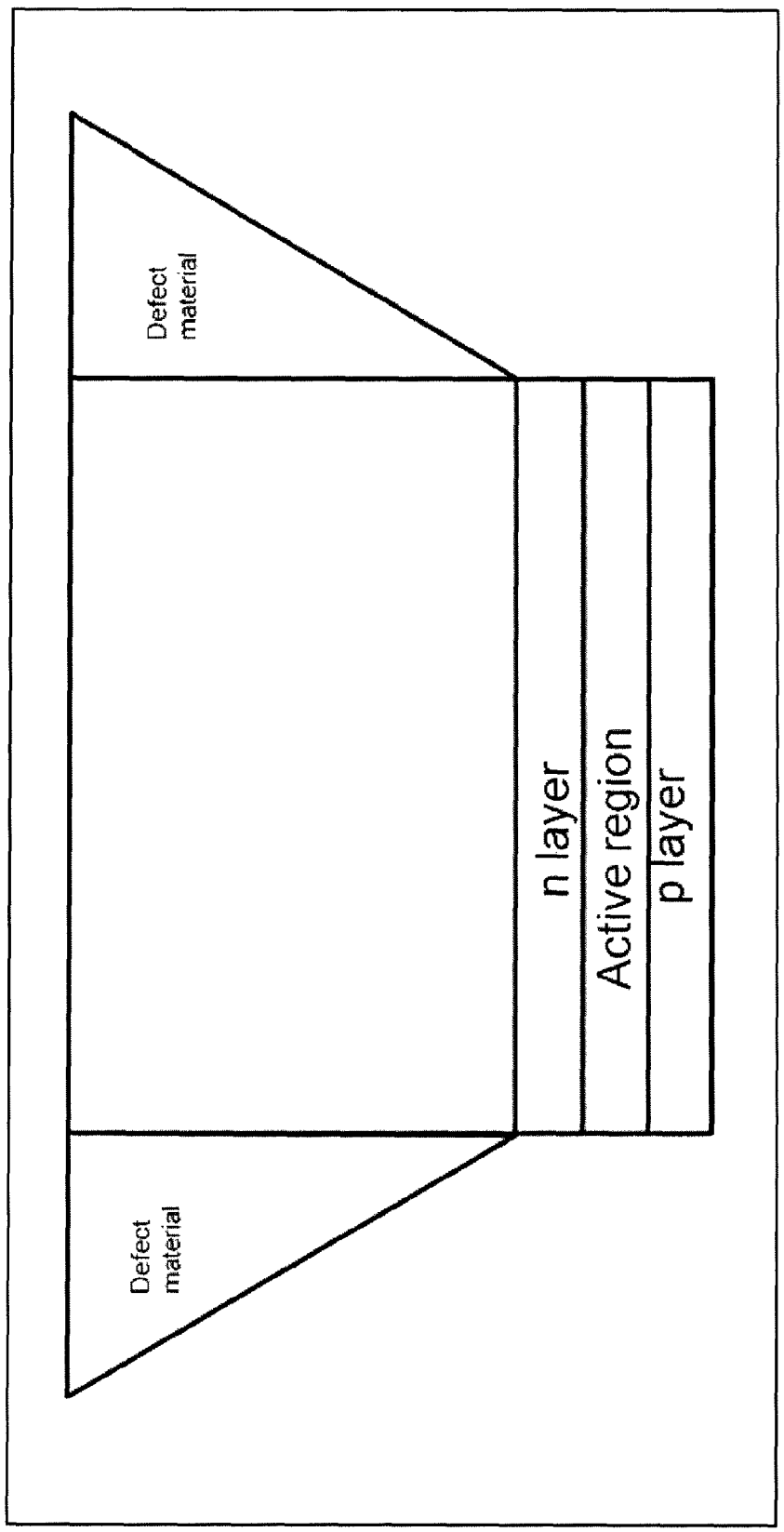
FIG. 17 is a diagram illustrating shaped device with a large radiation emitting surface.

FIG. 17 is a diagram illustrating shaped device with a large radiation emitting surface according to an embodiment. As an example, the shape device shown in FIG. 17 is formed from a substrate that has defect regions. For example, the substrate consists essentially of gallium nitride material, which is formed with a plurality of defect regions. As described above, defect regions are not suitable for being used for LED dies. In FIG. 7, the defect material regions are positioned at the lateral sides of the shaped device. The top surface of the shaped device has a larger area than the bottom surface. It is to be appreciated that the large surface area on the top surface allows light emitted by the shaped device to be efficiently emitted out of the shaped device. In addition, both the n layer and p layer are located at the bottom of the shape device, which allows the electrical contacts to be located near the bottom of the device. In various embodiments, the present disclosure provides an arrangement of electrically conductive contacts that are positioned at bottom of light emitting diodes.

Figure 18:
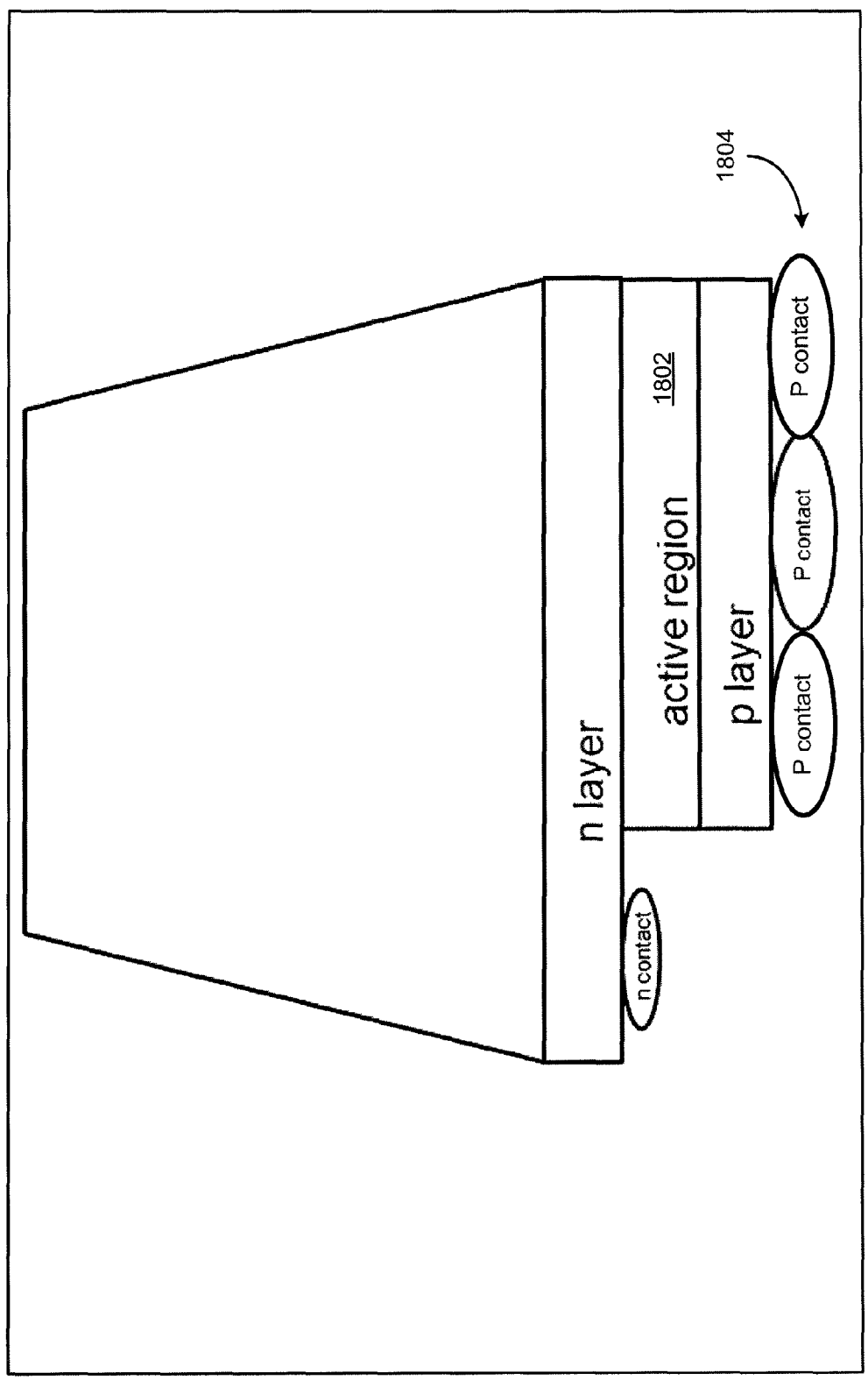
FIG. 18 is a diagram illustrating a shaped LED device where electrical contacts are positioned at the bottom.

FIG. 18 is a diagram illustrating a shaped LED device where electrical contacts 1804 are positioned at the bottom according to some embodiments. As shown in FIG. 18, n layer and p layer are both located at the bottom of an LED device. For example, the LED device comprises gallium and nitrogen material. The n layer and the p layer are separated by an active region 1802. The n layer is electrically coupled to an n-contact, and the p layer is electrically coupled to a p contact. As mentioned above, having both the n contact and the p contact at the bottom of the device can provide numerous advantages, such minimizing blocking the top surface of the shaped device. One or more mirrors may be employed to reflect a portion of generated photons.

Figure 19A:
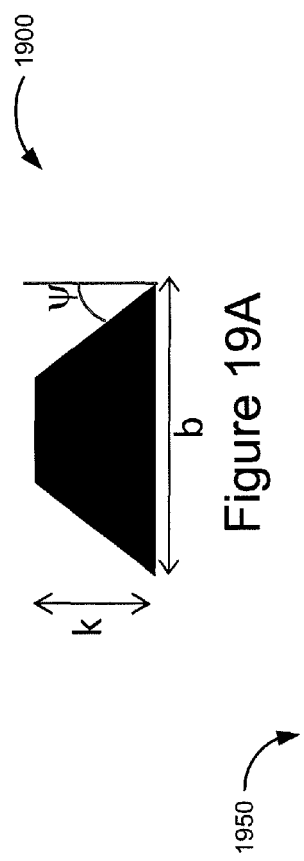
FIG. 19A and FIG. 19B depict variations in chip shape geometry and the corresponding impact on light extraction.
Figure 19B:
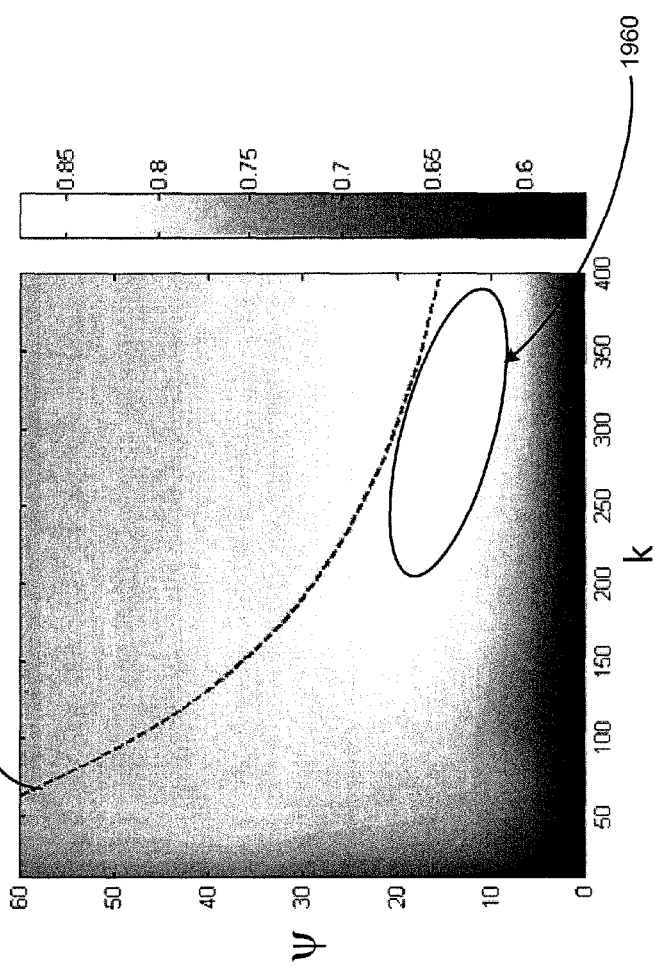

FIG. 19A and FIG. 19B depict variations in chip shape geometry and corresponding impact on light extraction, according to some embodiments. The geometry diagram 1900 as shown in FIG. 19A depicts a shaped LED device showing height k and vertical sidewall angle $\Psi$ of a tetragonal chip (e.g., having a triangular base). As the height k increases, the vertical sidewall angle $\Psi$ decreases, with the vertical sidewall angle $\Psi$ approaching zero for a large value of height k (e.g., while holding the independent geometric variables constant).

FIG. 19B depicts a light extraction plot 1950 as plotted across of range of chip shape geometries. As shown, the amount of light extraction is given in the range gradient 1960, with range gradient ranges from about 0.6 (60%) to about 0.85 (85%) as shown. The highest light extraction can be obtained when vertical sidewall angle $\Psi$ is about 10° to about 25° and for a height k>200 um. The corresponding highest light extraction range is shown in area 1960. The line 1910 corresponds to the maximum value of k for a given vertical sidewall angle $\Psi$. The base width is shown as value b (which is 380 um in the case of FIG. 19B). In exemplary embodiments, the value of b is in the range from about 50 um to about 5 mm.

Figure 20:
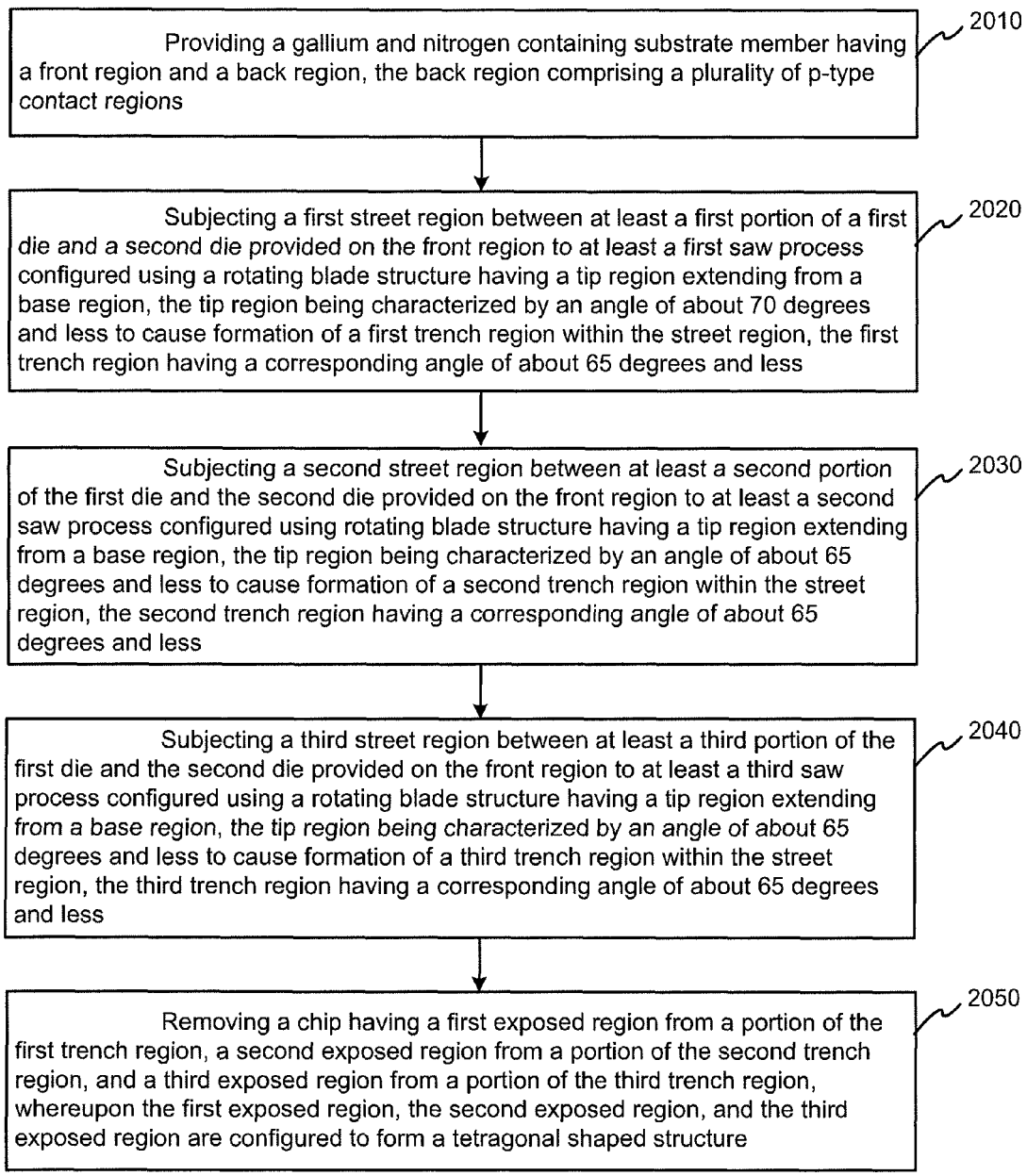
FIG. 20 is a diagram illustrating a method of shaping a substrate structure containing gallium and nitrogen material.

FIG. 20 is a diagram illustrating a method of shaping a substrate structure containing gallium and nitrogen material. As shown, the method comprises steps for shaping a substrate structure containing gallium and nitrogen material that is to be used for manufacturing optical device, the method comprising: providing a gallium and nitrogen containing substrate member having a front region and a back region, the back region comprising a plurality of p-type contact regions (see operation 2010); subjecting a first street region between at least a first portion of a first die and a second die provided on the front region to at least a first saw process configured using a rotating blade structure having a tip region extending from a base region, the tip region being characterized by an angle of about 70 degrees and less to cause formation of a first trench region within the street region, the first trench region having a corresponding angle of about 65 degrees and less (see operation 2020); subjecting a second street region between at least a second portion of the first die and the second die provided on the front region to at least a second saw process configured using rotating blade structure having a tip region extending from a base region, the tip region being characterized by an angle of about 65 degrees and less to cause formation of a second trench region within the street region, the second trench region having a corresponding angle of about 65 degrees and less (see operation 2030); subjecting a third street region between at least a third portion of the first die and the second die provided on the front region to at least a third saw process configured using a rotating blade structure having a tip region extending from a base region, the tip region being characterized by an angle of about 65 degrees and less to cause formation of a third trench region within the street region, the third trench region having a corresponding angle of about 65 degrees and less (see operation 2040); and removing a chip having a first exposed region from a portion of the first trench region, a second exposed region from a portion of the second trench region, and a third exposed region from a portion of the third trench region whereupon the first exposed region, the second exposed region, and the third exposed region are configured to form a tetragonal shaped structure (see operation 2050).

Following the aforementioned techniques, an optical device can be formed, the optical device comprising a gallium and nitrogen containing substrate material having a selected active region area of less than 65,000 microns square formed overlying the substrate; and having an extraction efficiency characterized by a maximum emission region for the selected active region area. In some embodiments, the extraction efficiency ranges from about 70% to about 90%. The device can be shaped such that the gallium and nitrogen containing substrate material is configured in a non-orthogonal shape such as a tetragonal shape. Or, the gallium and nitrogen containing substrate material can be configured as six pyramid shaped sides extending to respective six sides orthogonal to a base. In still another shapes, the optical device can be configured as six pyramid shaped sides extending to respective six sides orthogonal to a base from a flat top. The shape of the base can be characterized by a square shape, a hex shape, an annular shape, a rectangular shape, a circular shape, triangular, diamond. The gallium and nitrogen containing substrate material can be GaN, and can be configured as six pyramid shaped sides extending to respective six sides orthogonal to a base and a flat top. The shape can be performed using any one or more techniques, for example, shaping the substrate structure can include dicing, laser ablating, scribing, polishing, chemical etching, dry etching, plasma etching, and/or telekinesis.

In other embodiments of an optical device, the optical device can be configured of a gallium and nitrogen containing substrate structure, the structure comprising a base and at least six sides configured in a non-orthogonal spatial manner to the base; and having an active region configured in proximity to one or more mirror structures to cause a selective emission of electromagnetic radiation. Many such embodiments of such optical devices are possible, and examples include embodiments wherein the substrate structure is configured to provide a determined electromagnetic emission from the substrate structure, or wherein the optical device is one of a plurality of optical devices configured in an array pattern. In one such pattern, a device is provided with a plurality of chips, the plurality of chips being arranged according to a predetermined spatial separation, the spatial separation being adjustable (e.g., at least 10 microns, about 10 microns, etc.).

Still further, following the aforementioned techniques, optical devices can be isolated by separating small gallium and nitrogen containing chips from a substrate structure. One separation method can be performed by providing a patterned substrate comprising a backside region, the patterned substrate comprising a plurality of chips, each of the chips having a backside surface region; coupling the backside region of the substrate to a polymeric tape substrate to hold the patterned substrate on the tape substrate; subjecting the patterned substrate to a saw process to partially cut between at least two of the chips from the patterned substrate, the saw process being configured to cause a sheer force such that at least one of the chips detaches from the tape substrate if the blade penetrates through an entirety of a thickness of the substrate; removing the partially cut patterned substrate attached to the polymeric tape from the saw process; and breaking the patterned substrate to detach the chip. In exemplary embodiments of the method, the saw process comprises a suitable blade speed (e.g., 20,000 RPM to 70,000 RPM), and the saw process can comprise a feed speed of 0.5 mm per second and greater.

While the above is a full description of the specific embodiments, various modifications, alternative constructions and equivalents may be used. The present specification describes specific gallium and nitrogen containing surface orientations, but it would be recognized that any one of a plurality of family of plane orientations can be used, as well as other material(s) containing substrates. Therefore, the above description and illustrations should not be taken as limiting the scope of the embodiments as claimed.

What is claimed is:

1. A substrate structure comprising:
    a gallium and nitrogen containing material;
    a base region; and
    at least three sidewalls, wherein each of the at least three sidewalls comprises a first side region configured in a non-orthogonal orientation to the base region.

2. The substrate structure of claim 1 wherein the substrate structure has a Cex chip extraction efficiency of at least 0.5.

3. The substrate structure of claim 1 wherein at least one of the sidewalls comprises a vertical region, and the vertical region connects the first side region and the base region.

4. The substrate structure of claim 1 wherein the substrate structure is configured in a tetragonal shape wherein the first side region has an angle $\Psi$ between about 10° to about 25°.

5. The substrate structure of claim 3 wherein the vertical region is characterized by a first height and the first side region is characterized by a second height, the ratio of the first height and the second height being about 2:1.

6. The substrate structure of claim 3 wherein the vertical region is characterized by a first height and the first side region is characterized by a second height, the ratio of the first height and the second height configured to provide a Cex chip extraction efficiency of at least 0.5.

7. An optical device comprising:
    a substrate structure, wherein the substrate comprises:
        a gallium and nitrogen containing material;
        a base region; and
        at least six sidewalls, wherein each of the at least six sidewalls comprises a first side region configured in a non-orthogonal orientation to the base region; and
    an active region overlying the substrate, wherein the active region is configured in proximity to at least one mirror structure.

8. The optical device of claim 7 wherein the optical device is one of a plurality of optical devices configured in an array pattern to cause a determined emission pattern in the array pattern.

9. The optical device of claim 7 wherein the substrate has a Cex chip extraction efficiency of at least 0.5.

10. The optical device of claim 7 wherein at least one of the sidewalls comprises a vertical region, and the vertical region connects the first side region and the base region.

11. The optical device of claim 7 wherein the substrate is configured in a hexagonal shape wherein the first side region has an angle $\Psi$ between about 10° to about 25°.

12. The optical device of claim 10 wherein the vertical region is characterized by a first height and the first side region is characterized by a second height, the ratio of the first height and the second height being about 2:1.

13. The optical device of claim 11 wherein the vertical region is characterized by a first height and the first side region is characterized by a second height, the ratio of the first height and the second height configured to provide a Cex chip extraction efficiency of at least 0.5.

14. An optical device comprising:
a substrate structure, wherein the substrate structure comprises:
a gallium and nitrogen containing material;
a base region; and
at least three sidewalls, wherein each of the at least three sidewalls comprises a first side region configured in a non-orthogonal orientation to the base region; and
an active region overlying the substrate, wherein the active region is configured in proximity to at least one mirror structure.

15. The optical device of claim 14 wherein the substrate has a Cex chip extraction efficiency of at least 0.5.

16. The optical device of claim 14 wherein at least one sidewall comprises a vertical region, and the vertical region connect the first side region and the base region.

17. The optical device of claim 14 wherein the substrate is configured in a tetragonal shape, and the first side region has an angle $\Psi$ between about 10° to about 25°.

18. The optical device of claim 16 wherein the vertical region is characterized by a first height and the first side region is characterized by a second height, the ratio of the first height and the second height being about 2:1.

19. The optical device of claim 17 wherein the vertical region is characterized by a first height and the first side region is characterized by a second height, the ratio of the first height and the second height configured to have a Cex chip extraction efficiency of at least 0.5.

20. A substrate structure comprising:
a gallium and nitrogen containing material;
a base region; and
at least six sidewalls, wherein each of the at least six sidewalls comprises a first side region configured in a non-orthogonal orientation to the base region.

21. The substrate structure of claim 20 wherein the substrate structure has a Cex chip extraction efficiency of at least 0.5.

22. The substrate structure of claim 20 wherein at least one of the sidewalls comprises a vertical region, and the vertical region connects the first side region and the base region.

23. The substrate structure of claim 22 wherein the substrate structure is configured in a hexagonal shape , and the first side region has an angle $\Psi$ between about 10° to about 25°.

24. The substrate structure of claim 22 wherein the vertical region is characterized by a first height and the first side region is characterized by a second height, the ratio of the first height and the second height being about 2:1.

25. The substrate structure of claim 23 wherein the vertical region is characterized by a first height and the first side region is characterized by a second height, the ratio of the first height and the second height configured to have a Cex chip extraction efficiency of at least 0.5.

* * * * *